(12) United States Patent
Sakai et al.

(10) Patent No.: US 12,242,340 B2
(45) Date of Patent: Mar. 4, 2025

(54) MEMORY CELL ARRAY UNIT

(71) Applicant: SONY SEMICONDUCTOR SOLUTIONS CORPORATION, Kanagawa (JP)

(72) Inventors: Lui Sakai, Kanagawa (JP); Yasuo Kanda, Kanagawa (JP)

(73) Assignee: SONY SEMICONDUCTOR SOLUTIONS CORPORATION, Tokyo (JP)

( * ) Notice: Subject to any disclaimer, the term of this patent is extended or adjusted under 35 U.S.C. 154(b) by 14 days.

(21) Appl. No.: 18/248,541

(22) PCT Filed: Oct. 7, 2021

(86) PCT No.: PCT/JP2021/037180
§ 371 (c)(1),
(2) Date: Apr. 11, 2023

(87) PCT Pub. No.: WO2022/085470
PCT Pub. Date: Apr. 28, 2022

(65) Prior Publication Data
US 2023/0376376 A1    Nov. 23, 2023

(30) Foreign Application Priority Data
Oct. 19, 2020    (JP) ................. 2020-175666

(51) Int. Cl.
G06F 11/00      (2006.01)
G06F 11/10      (2006.01)
H10B 63/00      (2023.01)

(52) U.S. Cl.
CPC .......... *G06F 11/1044* (2013.01); *G06F 11/10* (2013.01); *G06F 11/1028* (2013.01); *H10B 63/00* (2023.02)

(58) Field of Classification Search
CPC ... G06F 11/10; G06F 11/1028; G06F 11/1044
See application file for complete search history.

(56) References Cited

U.S. PATENT DOCUMENTS 5,375,255 A  * 12/1994 Baier ................. H03G 7/007
                                                          455/308
7,230,600 B1    6/2007 Huang
(Continued)

FOREIGN PATENT DOCUMENTS

JP      01-271974 A    10/1989
JP      08-328757 A    12/1996
(Continued)

OTHER PUBLICATIONS

International Search Report and Written Opinion of PCT Application No. PCT/JP2021/037180, issued on Dec. 14, 2021, 09 pages of ISRWO.

*Primary Examiner* — Joshua P Lottich
(74) *Attorney, Agent, or Firm* — CHIP LAW GROUP

(57) ABSTRACT

A memory cell array unit according to an embodiment of the present disclosure includes a microcontroller that performs reading and writing from and into a memory cell array using n-bit allocation memory cells on the basis of read/write control from a memory controller. When a defect is found in one of the n-bit allocation memory cells, the microcontroller writes n−1-bit write data excluding data of a least significant bit among n-bit write data into n−1-bit allocation memory cells excluding the defective allocation memory cell among the n-bit allocation memory cells.

7 Claims, 15 Drawing Sheets

(56) References Cited

U.S. PATENT DOCUMENTS

| | | | | |
|---|---|---|---|---|
| 2001/0052090 | A1* | 12/2001 | Mio | G11C 29/42 |
| 2003/0163501 | A1* | 8/2003 | Yang | H03H 17/0461 |
| | | | | 708/320 |
| 2003/0198103 | A1* | 10/2003 | Kamei | G11C 29/846 |
| | | | | 365/200 |
| 2010/0115176 | A1* | 5/2010 | Sarin | G11C 8/10 |
| | | | | 365/185.17 |
| 2012/0159281 | A1* | 6/2012 | Shalvi | G06F 11/1076 |
| | | | | 714/763 |
| 2016/0277040 | A1* | 9/2016 | Tong | H03M 13/356 |
| 2020/0090630 | A1* | 3/2020 | Wang | G09G 3/2014 |
| 2020/0159613 | A1* | 5/2020 | Otterstedt | G06F 11/102 |
| 2021/0193246 | A1* | 6/2021 | Jo | G11C 29/42 |

FOREIGN PATENT DOCUMENTS

| | | |
|---|---|---|
| JP | 2001-351398 A | 12/2001 |
| JP | 2009-098853 A | 5/2009 |
| JP | 2017-033170 A | 2/2017 |
| JP | 2019-168749 A | 10/2019 |

* cited by examiner

[FIG. 1]
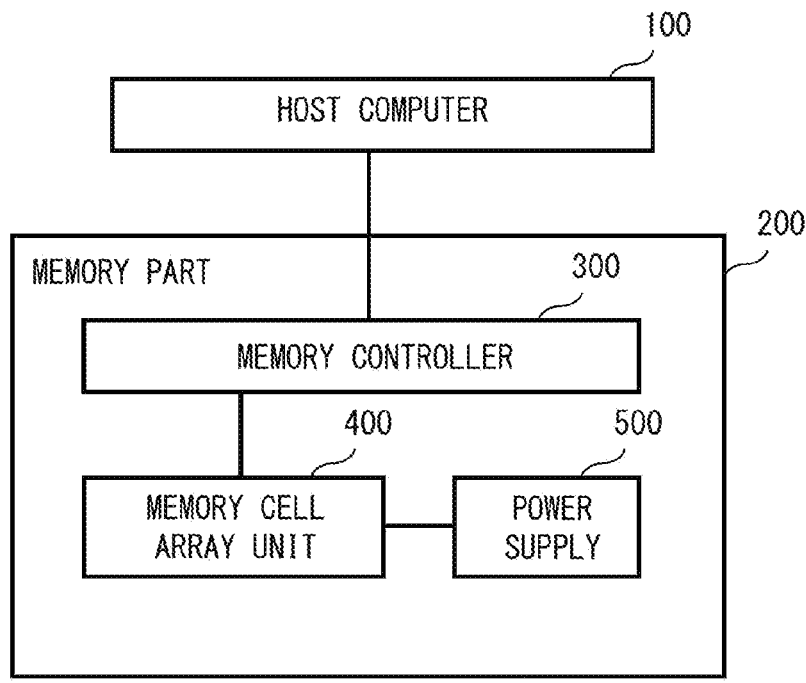
[FIG. 2]
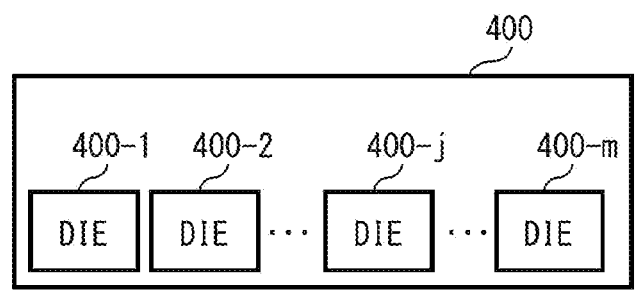

[FIG. 3]
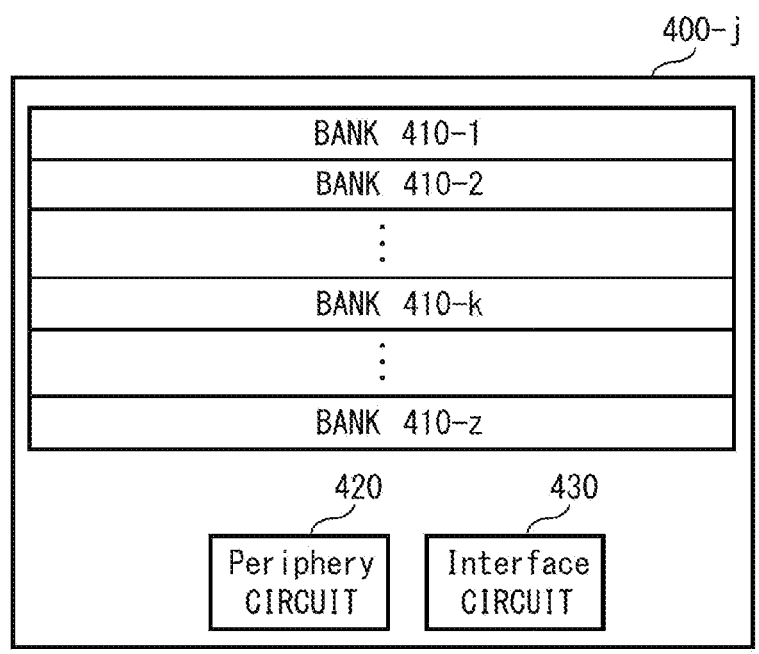

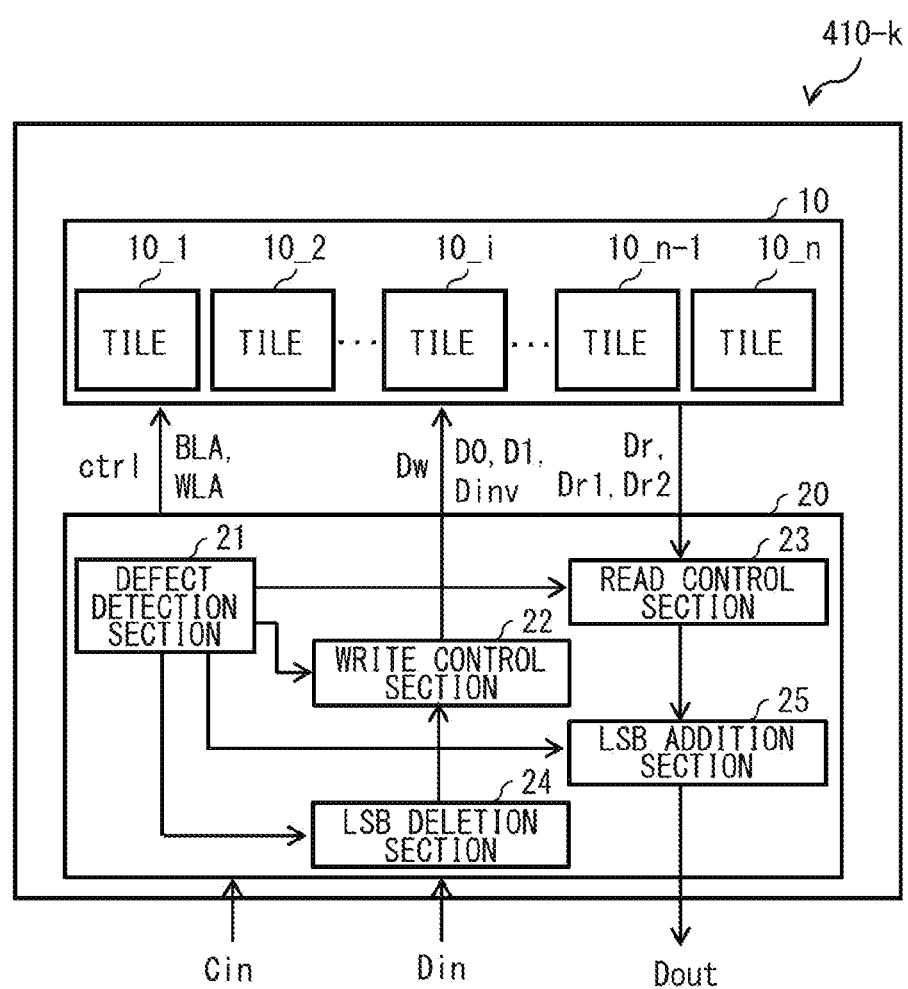
[ FIG. 4 ]

[ FIG. 5 ]
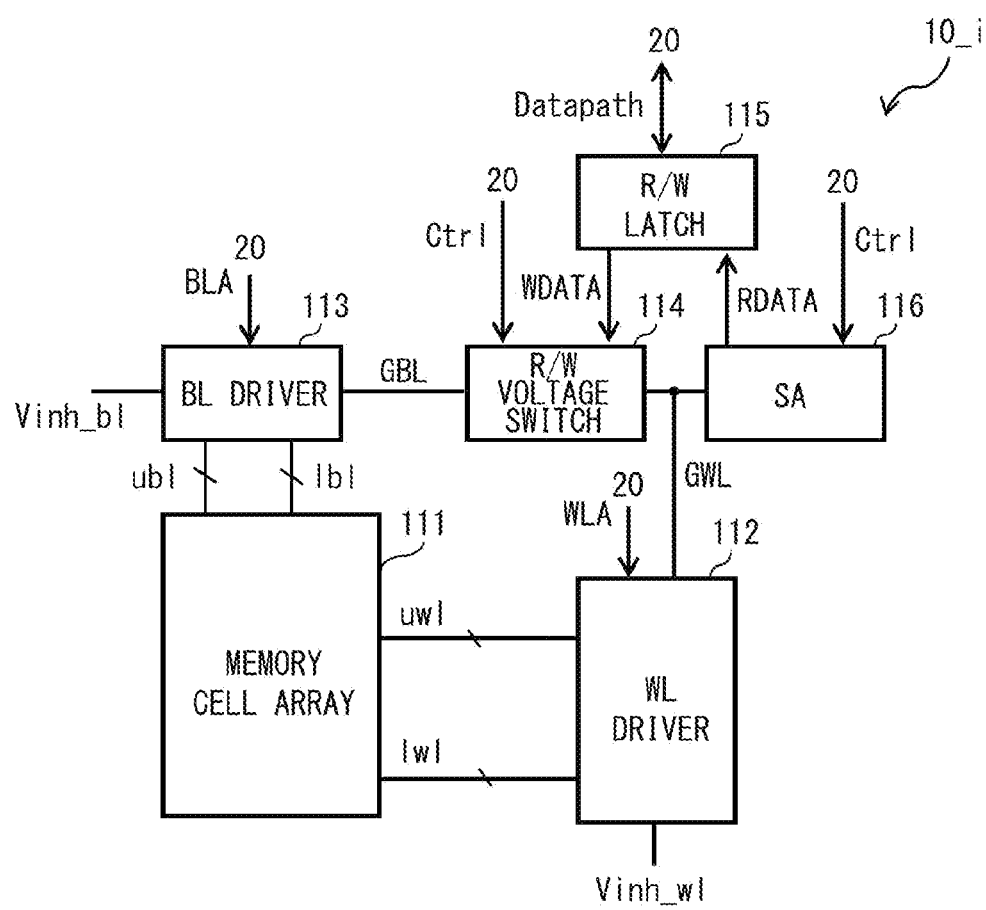

[ FIG. 6 ]
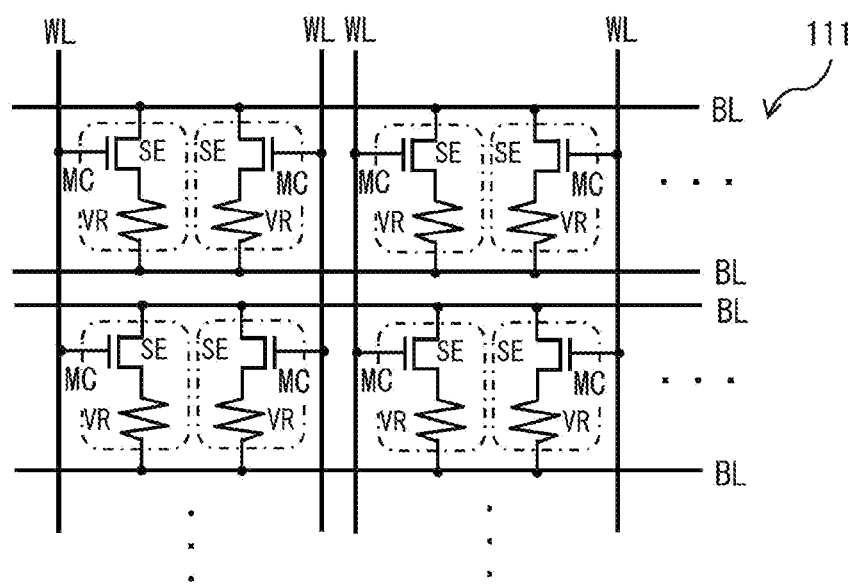

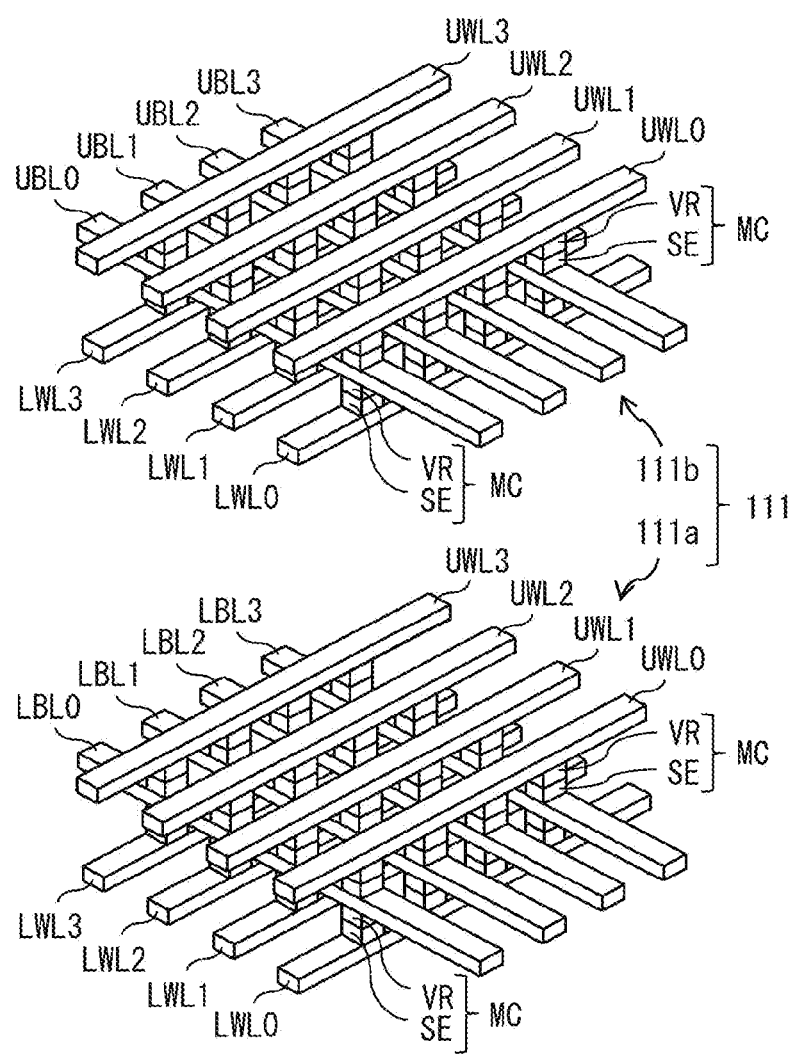
[FIG. 7]

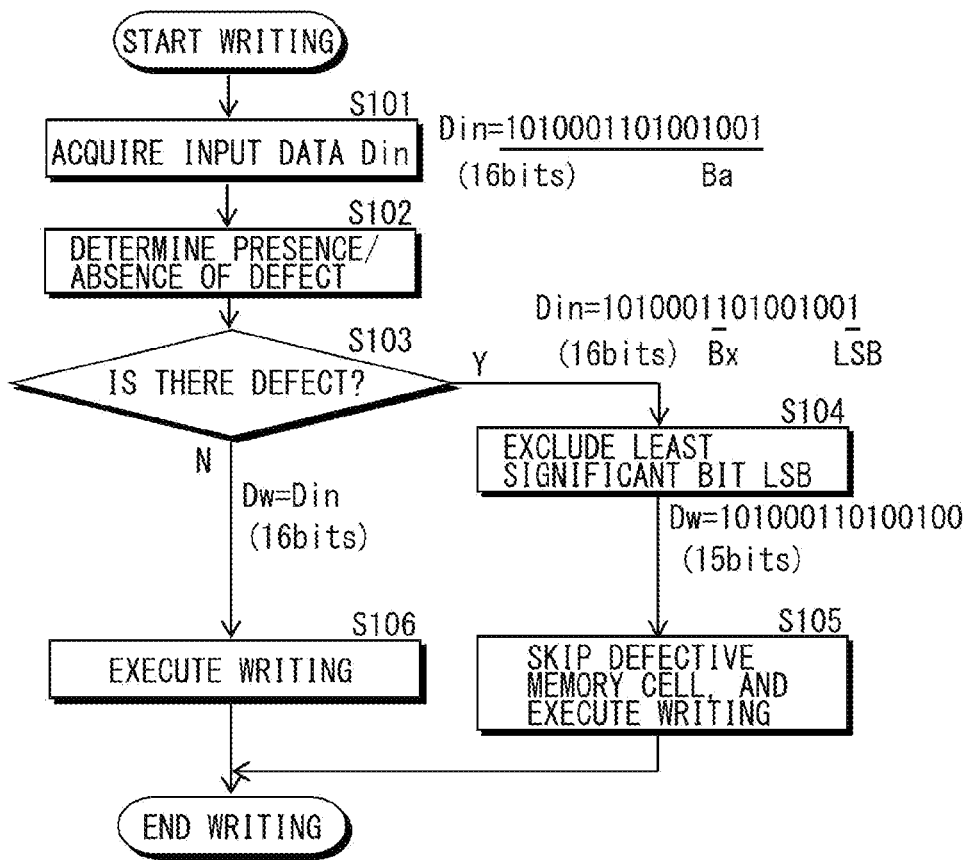
[FIG. 8]

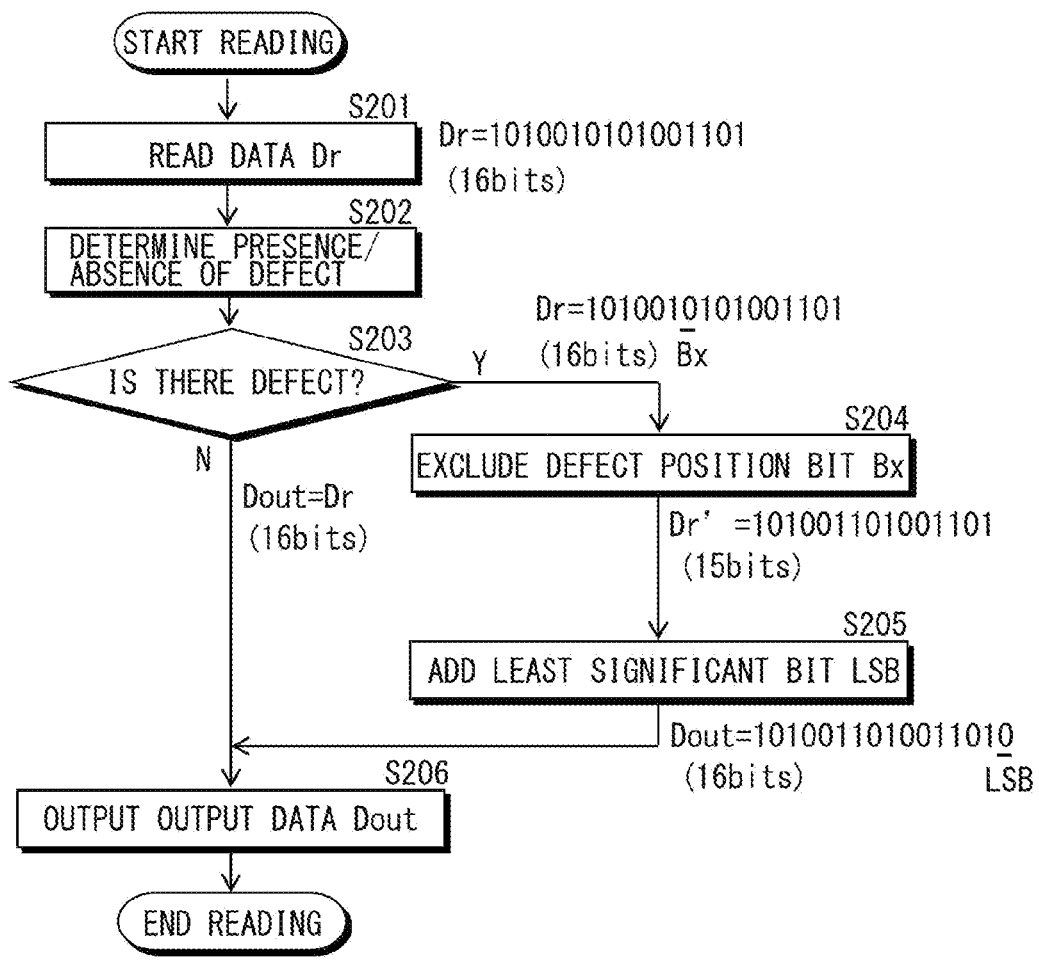
[FIG. 9]

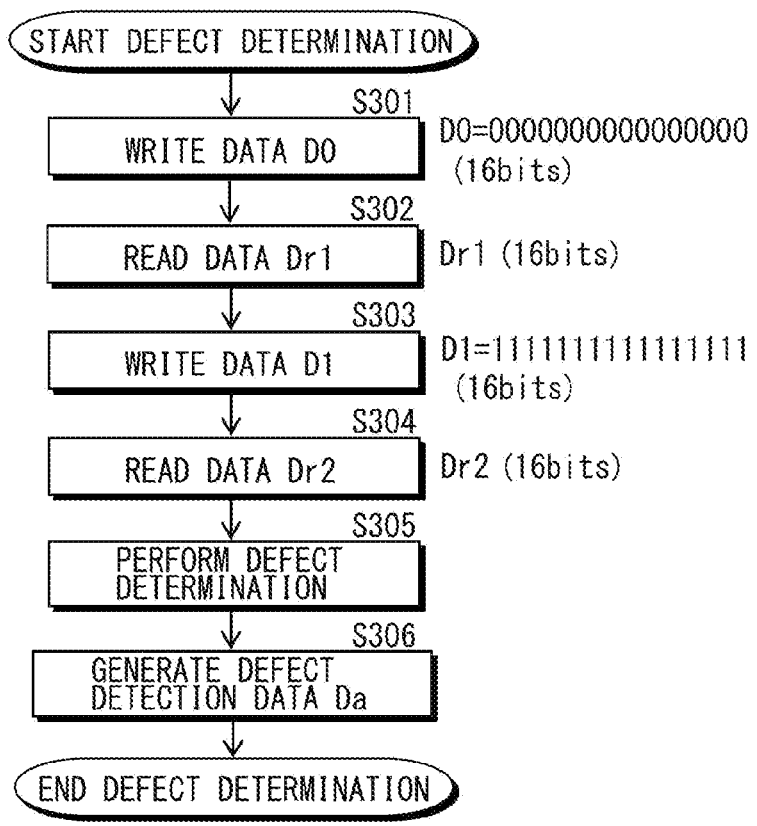

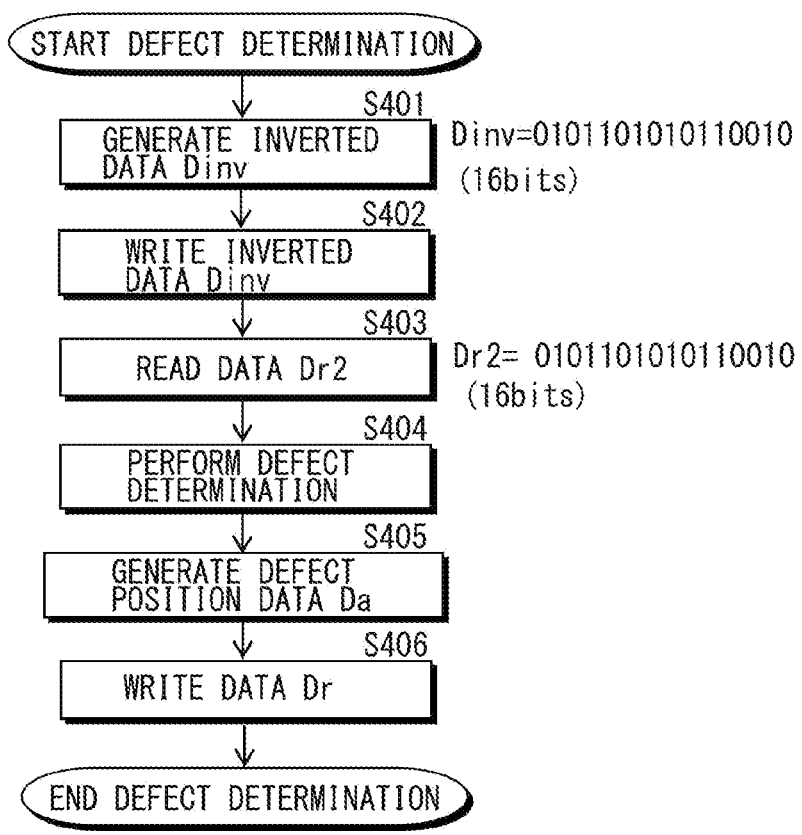

[ FIG. 12 ]
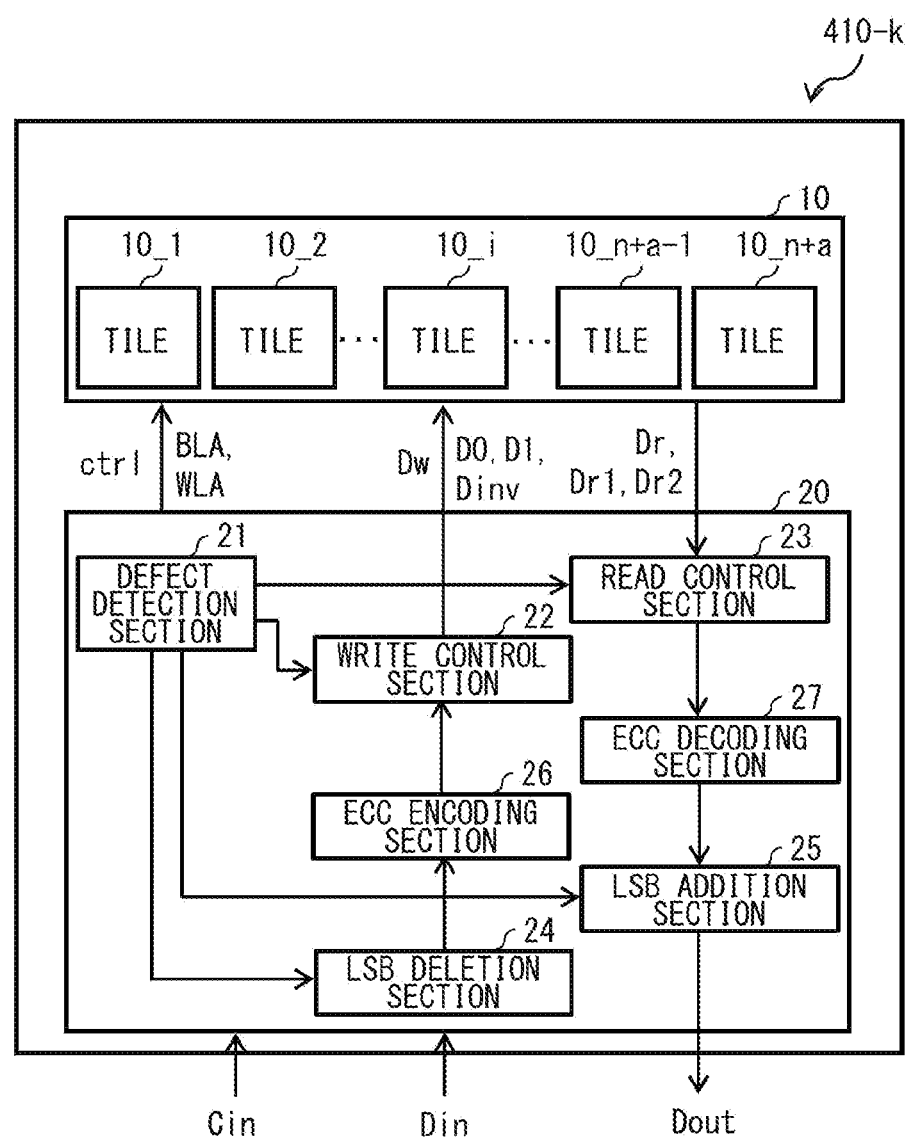

[ FIG. 13 ]
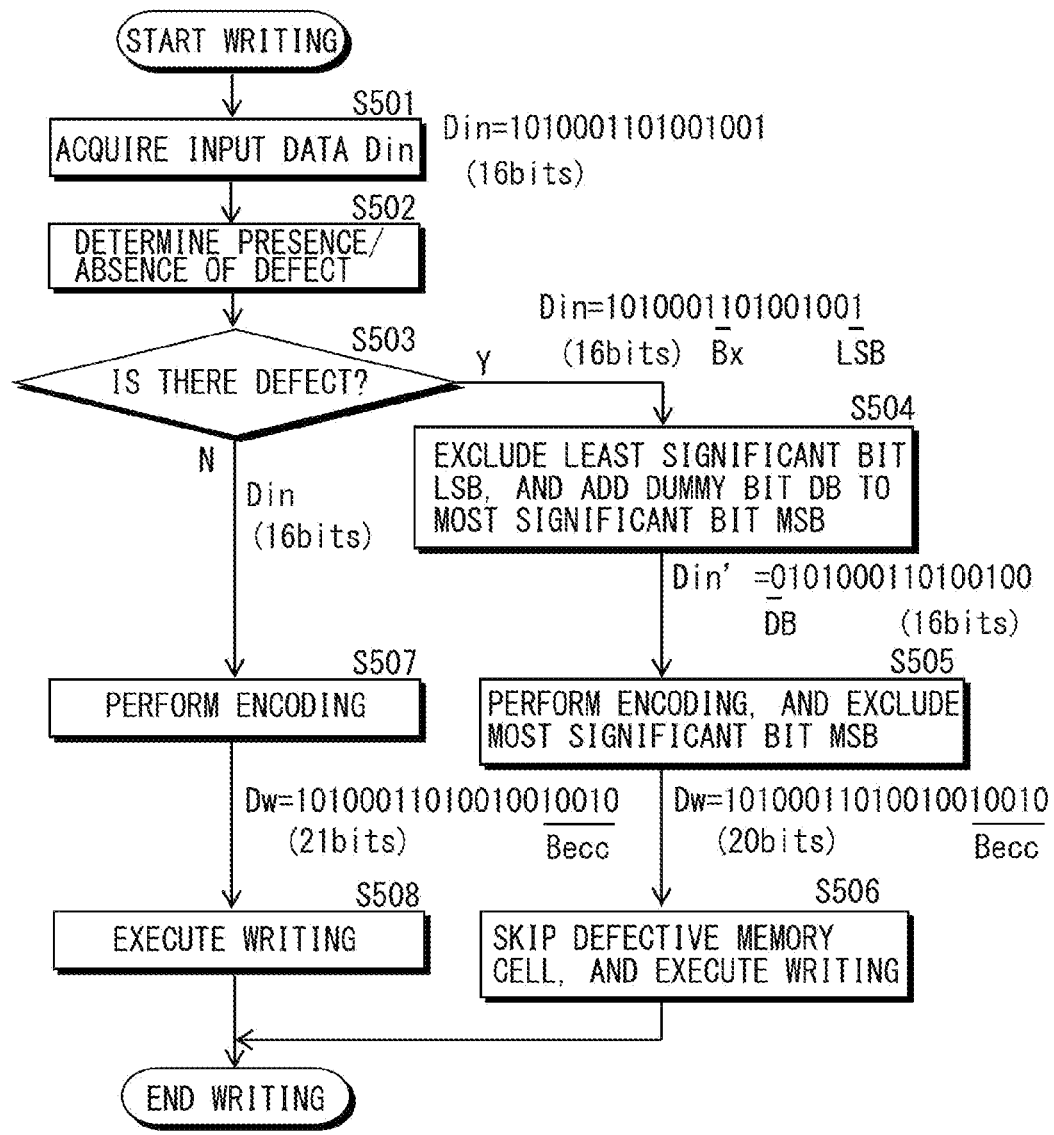

[ FIG. 14 ]
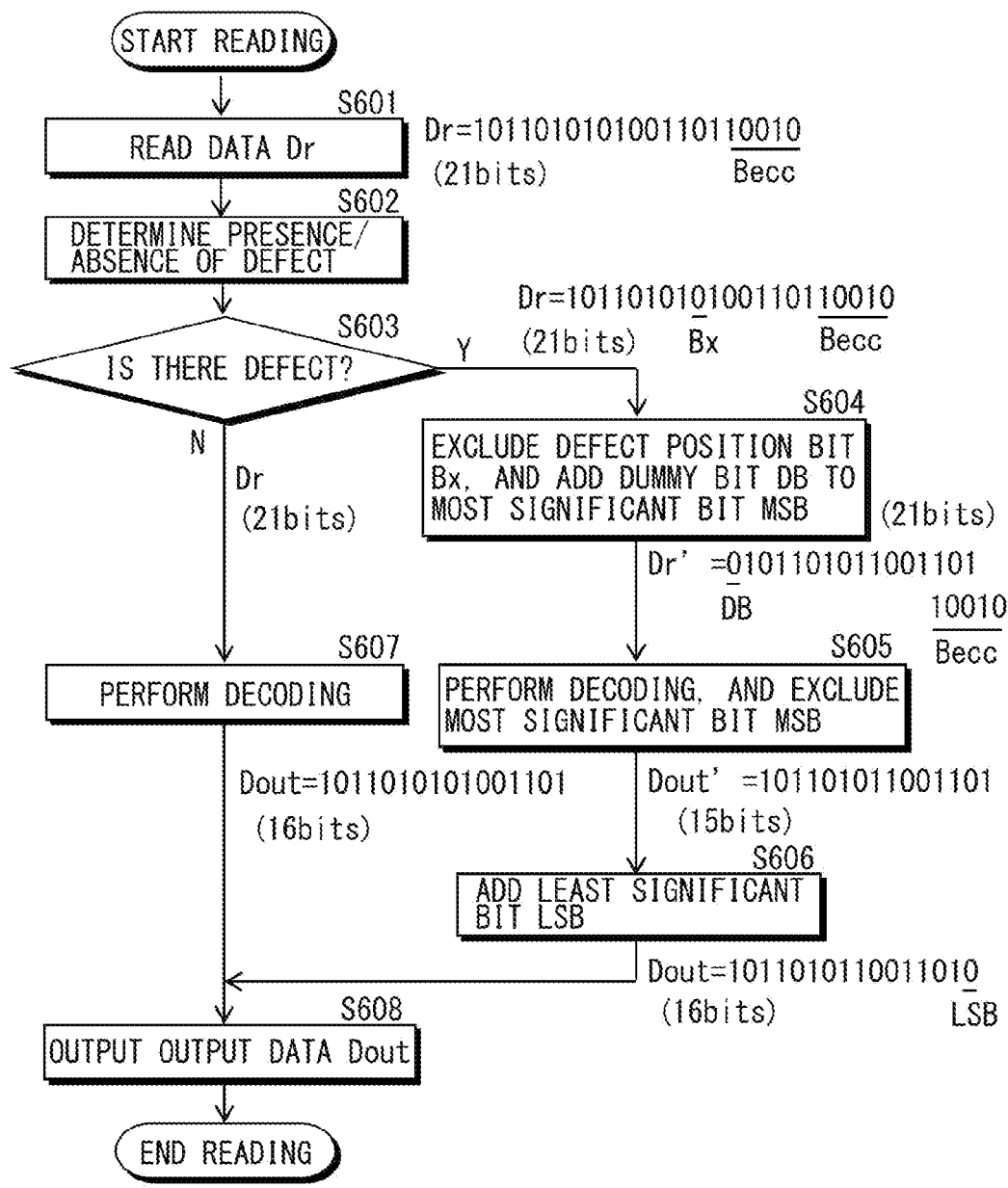

[ FIG. 15 ]
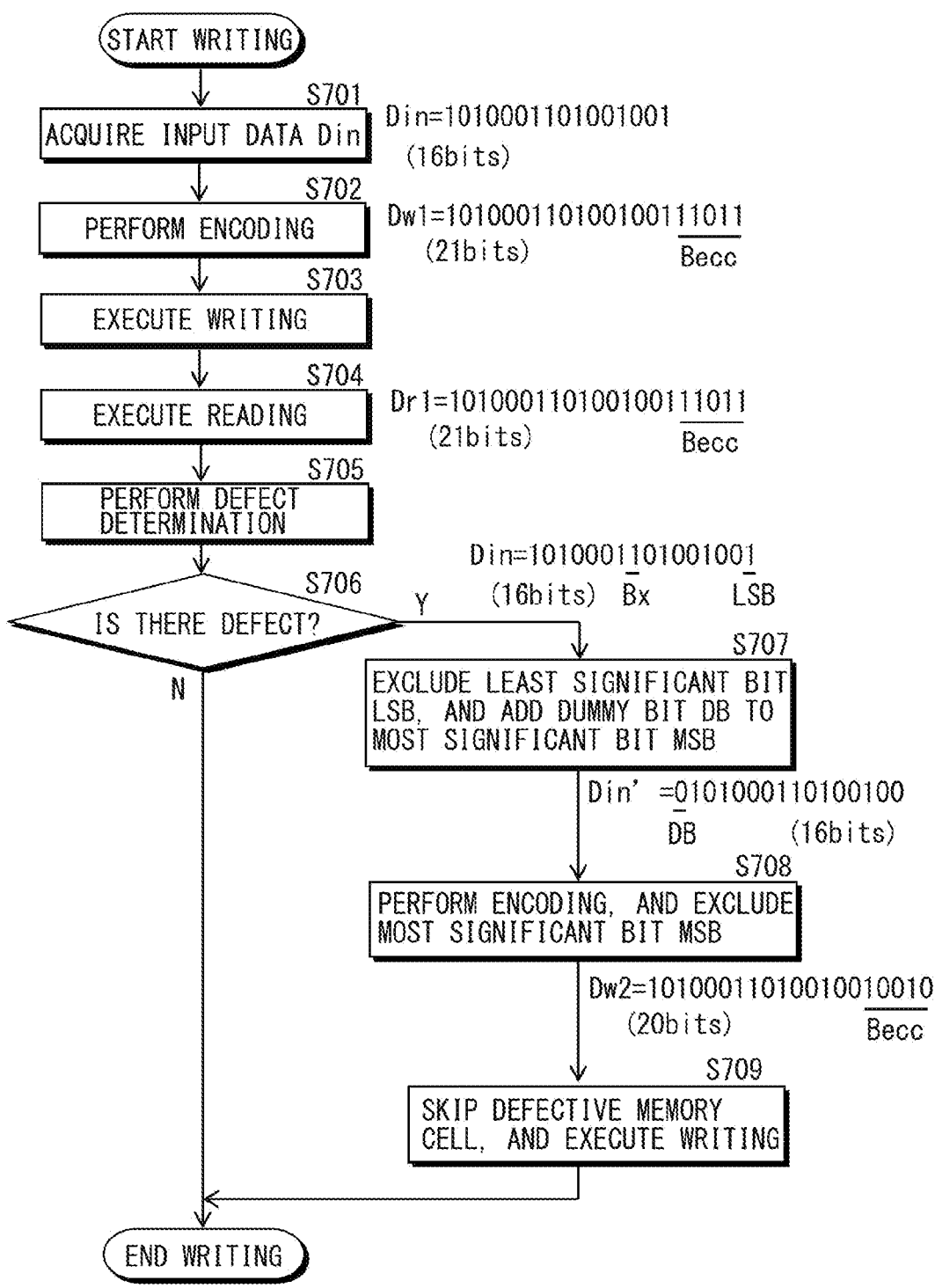

[ FIG. 16 ]
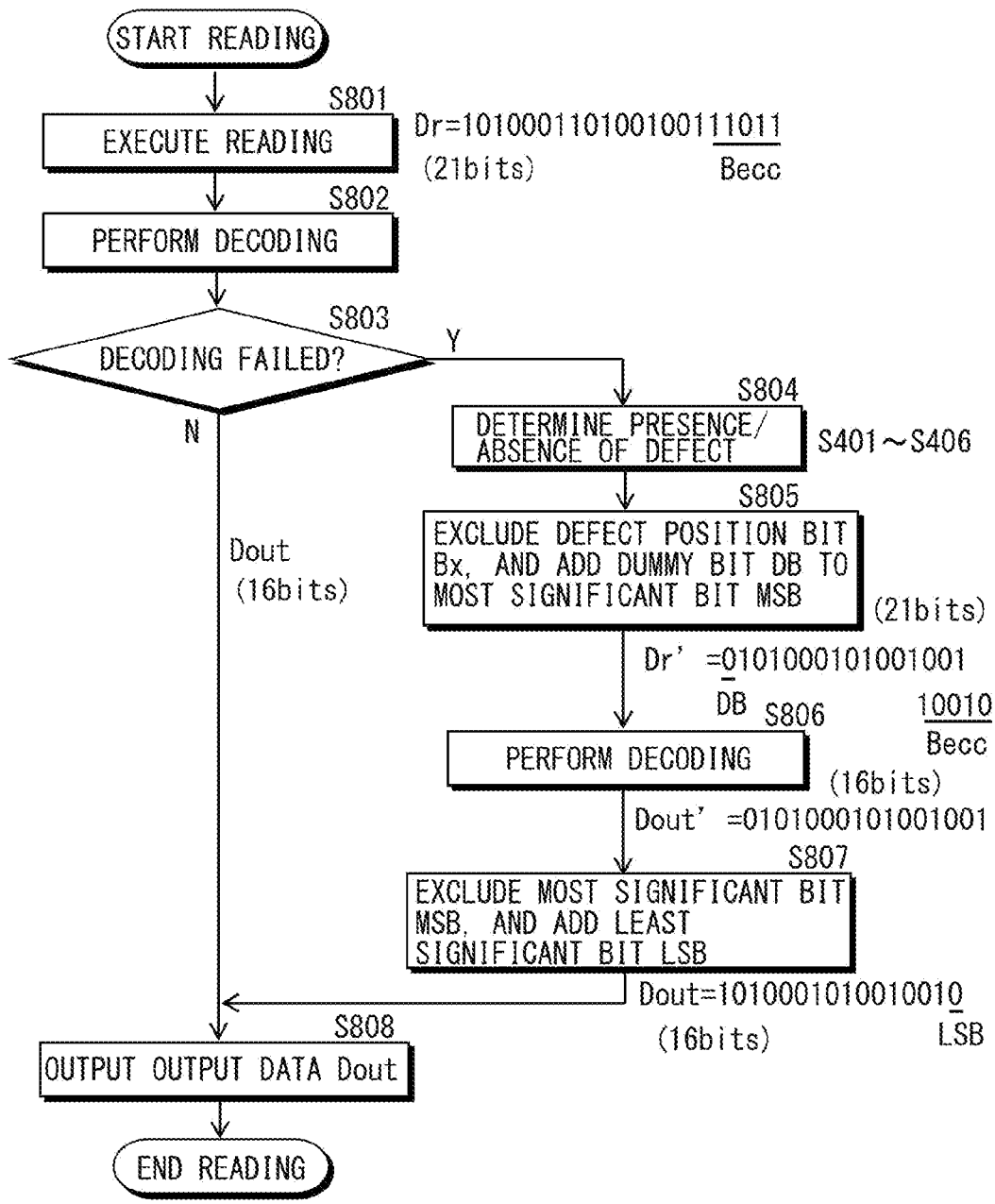

MEMORY CELL ARRAY UNIT

CROSS REFERENCE TO RELATED APPLICATIONS

This application is a U.S. National Phase of International Patent Application No. PCT/JP2021/037180 filed on Oct. 7, 2021, which claims priority benefit of Japanese Patent Application No. JP 2020-175666 filed in the Japan Patent Office on Oct. 19, 2020. Each of the above-referenced applications is hereby incorporated herein by reference in its entirety.

TECHNICAL FIELD

The present disclosure relates to a memory cell array unit.

BACKGROUND ART

A memory cell array unit including a rewritable non-volatile memory element has heretofore been known. In recent years, focus has been placed on a resistive RAM (ReRAM (Resistive RAM) as a rewritable memory cell array unit provided with a storage capacity exceeding that of a DRAM while having non-volatility. In a case where a defect occurs in a certain non-volatile memory element in such a memory cell array unit, it is conceivable to store address information on the defective non-volatile memory element, for example, in a defect position table, in order to avoid the defective non-volatile memory element (see, e.g., PTLs 1 to 3).

CITATION LIST

Patent Literature

PTL 1: Japanese Unexamined Patent Application Publication No. 2009-98853
PTL 2: Japanese Unexamined Patent Application Publication No. H8-328757
PTL 3: Japanese Unexamined Patent Application Publication No. H1-271974

SUMMARY OF THE INVENTION

In a case where there are a large number of defective non-volatile memory elements, however, a defect position table having a large capacity is necessary to store address information thereon. In addition, the above-described memory cell array unit may employ an error correction code in some cases as a countermeasure for errors after writing. However, in a case where a defective non-volatile memory element is allocated to an LSB in order to be less influenced by the defective non-volatile memory element, any bits are influenced in the same manner for the error correction code. Therefore, the use of the defective non-volatile memory element increases probability of a failure in decoding, thus degrading error resilience to a later defect. It is therefore desirable to provide a memory cell array unit that makes it possible to deal with a later defect of a memory without using a defect position table.

A memory cell array unit according to an embodiment of the present disclosure is a memory cell unit that is subjected to read/write control of n-bit data by a memory controller. The memory cell array unit includes a memory cell array and a microcontroller. The memory cell array includes n-bit allocation memory cells allocated from the memory controller in a manner corresponding to the n-bit data in the read/write control. The microcontroller performs reading and writing from and into the memory cell array using the n-bit allocation memory cells on the basis of the read/write control from the memory controller. When a defect is found in one of the n-bit allocation memory cells, the microcontroller writes n−1-bit write data excluding data of a least significant bit among n-bit write data into n−1-bit allocation memory cells excluding the defective allocation memory cell among the n-bit allocation memory cells.

In the memory cell array unit according to an embodiment of the present disclosure, when a defect is found in one of the n-bit allocation memory cells in the memory cell array, the n−1-bit write data excluding data of the least significant bit among the n-bit write data is written into the n−1-bit allocation memory cells excluding the defective allocation memory cell among the n-bit allocation memory cells. Accordingly, for example, in a case where encoding is performed using the n−1-bit write data written into the n−1-bit allocation memory cells, there is no influence of the defective allocation memory cell upon decoding, which may therefore suppress probability of a failure in decoding to a low level. As a result, it is possible to deal with a later defect of a memory as well without using a defect position table.

BRIEF DESCRIPTION OF THE DRAWINGS

FIG. 1 is a diagram illustrating an example of a schematic configuration of an information processing system according to an embodiment.
FIG. 2 is a diagram illustrating an example of a schematic configuration of a memory cell array unit in FIG. 1.
FIG. 3 is a diagram illustrating an example of a schematic configuration of each die in FIG. 2.
FIG. 4 is a diagram illustrating an example of a schematic configuration of each bank in FIG. 3.
FIG. 5 is a diagram illustrating an example of a schematic configuration of each tile in FIG. 4.
FIG. 6 is a diagram illustrating an example of a schematic configuration of a memory cell array in FIG. 5.
FIG. 7 is a diagram illustrating an example of a schematic configuration of the memory cell array in FIG. 5.
FIG. 8 is a diagram illustrating an example of a writing operation in the bank in FIG. 4.
FIG. 9 is a diagram illustrating an example of a reading operation in the bank in FIG. 4.
FIG. 10 is a diagram illustrating an example of a procedure to determine presence or absence of a defect in FIGS. 8 and 9.
FIG. 11 is a diagram illustrating a modification example of the procedure to determine presence or absence of a defect in FIGS. 8 and 9.
FIG. 12 is a diagram illustrating a modification example of a schematic configuration of the bank in FIG. 4.
FIG. 13 is a diagram illustrating an example of a writing operation in the bank in FIG. 12.
FIG. 14 is a diagram illustrating an example of a reading operation in the bank in FIG. 12.
FIG. 15 is a diagram illustrating a modification example of the writing operation in the bank in FIG. 12.
FIG. 16 is a diagram illustrating a modification example of the reading operation in the bank in FIG. 12.

MODES FOR CARRYING OUT THE INVENTION

Hereinafter, detailed description is given of modes for carrying out the present disclosure with reference to the drawings. However, embodiments described below are merely exemplary, and there is no intention of excluding application of various modifications and technologies not explicitly described below. The present technology can be implemented by making modifications in a wide variety of ways (e.g., combining embodiments, etc.) in a range not deviating from the gist of the present technology. In addition, in the following description of the drawings, the same or similar portions are denoted by the same or similar reference numerals. The drawings are schematic, and do not necessarily correspond to actual dimensions, proportions, or the like. The drawings may also include portions in which dimensional relationships or proportions differ from each other.

1. EMBODIMENT

[Configuration]

FIG. 1 illustrates an example of functional blocks of an information processing system according to an embodiment. The information processing system includes a host computer 100 and a memory part 200. The memory part 200 includes a memory controller 300, one or a plurality of memory cell array units 400, and a power supply 500. FIG. 1 exemplifies a state where one memory cell array unit 400 is provided. The memory part 200 corresponds to a specific example of a "memory module" of the present disclosure.

(Host Computer 100)

The host computer 100 controls the memory part 200. Specifically, the host computer 100 issues a command designating a logical address to be accessed, and supplies the command or data to the memory part 200. The host computer 100 receives data outputted from the memory part 200. Here, the command is directed to controlling the memory part 200, and includes, for example, a write command ordering processing to write data, or a read command ordering processing to read data. In addition, the logical address is an address allocated for each access unit region when the host computer 100 accesses the memory part 200 in an address space defined by the host computer 100.

(Memory Controller 300)

The memory controller 300 controls the one or the plurality of memory cell array units 400. The memory controller 300 receives a write command designating a logical address from the host computer 100. In addition, the memory controller 300 executes the processing to write data in accordance with the write command. In this write processing, the logical address is converted into a physical address, and data is written into the physical address. Here, the physical address is an address allocated in the one or the plurality of memory cell array units 400 for each access unit at the time when the memory controller 300 accesses the one or the plurality of memory cell array units 400. When receiving a read command designating a logical address, the memory controller 300 converts the logical address into a physical address, and reads data from the physical address. Then, the memory controller 300 outputs, as read data, the read data to the host computer 100.

(Power Supply 500)

The power supply 500 supplies a desired voltage to the one or the plurality of memory cell array units 400. The power supply 500 supplies a WL driver 112 described later, for example, with a voltage or the like to be used upon writing or reading. The power supply 500 supplies a BL driver 113 described later, for example, with a voltage or the like to be used upon writing or reading.

(Memory Cell Array Unit 400)

Next, description is given of the memory cell array unit 400. FIG. 2 illustrates an example of functional blocks of the memory cell array unit 400. The memory cell array unit 400 is configured by, for example, semiconductor chips. As illustrated in FIG. 2, the memory cell array unit 400 includes, for example, m pieces of dies 400-$j$ (1≤j≤m). As illustrated in FIG. 3, each of the dies 400-$j$ includes, for example, z pieces of banks 410-$k$ (1≤k≤z), a Periphery circuit 420 that controls access to each of the banks 410-$k$, and an Interface circuit 430 that communicates with the memory controller 300.

As illustrated in FIG. 4, each of the banks 410-$k$ includes, for example, a memory cell array 10 and a microcontroller 20.

The memory cell array 10 includes n pieces of (16 when n=16) tiles 10_$i$ (1≤i≤n) each having a 1-bit access unit. The microcontroller 20 controls access to each of the tiles 10_$i$, and communicates with the memory controller 300. In each of the banks 410-$k$, the microcontroller 20 operates the plurality of tiles 10_$i$ in a coordinated manner to achieve access to a data block of a predetermined bit size as a whole.

In each of the banks 410-$k$, for example, the microcontroller 20 uses an n-bit allocation bit Ba allocated to each of the banks 410-$k$ from the memory controller 300 for data writing or data reading, on the basis of read/write control from the memory controller 300, to perform reading and writing from and into the memory cell array 10. The memory cell array 10 includes n-bit (n pieces of) allocation memory cells (memory cells MC described later) to which the n-bit allocation bits Ba are allocated. The memory cell array 10 is not provided with a switching mechanism (e.g., fuse circuit) that switches to a 1-bit redundant memory cell as a substitution for a portion of n-bit allocation memory cells.

In each of the banks 410-$k$, for example, the microcontroller 20 accesses an n-bit data block on the basis of the read/write control from the memory controller 300. At this time, the microcontroller 20 accesses the n-bit allocation memory cell in the memory cell array 10. In each of the banks 410-$k$, the microcontroller 20 accesses the n-bit allocation memory cell, for example, when performing "defect determination (described later)" which is preprocessing upon data writing or data reading.

Each of the tiles 10_$i$ includes, for example, a memory cell array 111 as illustrated in FIG. 5. For example, as illustrated in FIG. 6, the memory cell array 111 includes a 1-bit memory cell MC at each intersection of a word line WL and a bit line BL. The memory cell MC is a writable non-volatile memory. The memory cell MC has a series structure of a resistance change element VR (Variable Resistor) and a selection element SE (Selector Element). The resistance change element VR records 1-bit information depending on a state of high and low of a resistance value, and the selection element SE has bidirectional diode characteristics.

It is to be noted that the memory cell array 111 may be configured by memory cell arrays 111$a$ and 111$b$ in two layers, for example, as illustrated in FIG. 7. As illustrated in FIG. 7, each of the memory cell arrays 111$a$ and 111$b$ includes, for example, a 1-bit memory cell MC at each intersection point of an upper word line UWL and a bit line BL, and at each intersection of a lower word line LWL and the bit line BL. The memory cell MC is a writable non-volatile memory. The memory cell MC has a series structure of a resistance change element VR (Variable Resistor) and a selection element SE (Selector Element). The resistance change element VR records 1-bit information depending on a state of high and low of a resistance value, and the selection element SE has bidirectional diode characteristics. Hereinafter, a word line WL is appropriately used as a generic term for the upper word line UWL and the lower word line LWL.

As illustrated in FIG. 5, each of the tiles 11 includes, for example, the WL driver 112, the BL driver 113, an R/W voltage switch 114, an R/W latch 115, and a sense amplifier (SA) 116.

On the basis of a control signal (a word line address WLA) by the microcontroller 20, the WL driver 112 applies a predetermined voltage to each word line WL. A voltage Vinh_wl (e.g., 0 V) to be given to a non-selected word line WL is inputted to the WL driver 112. On the basis of a control signal (a bit line address BLA) by the microcontroller 20, the BL driver 113 selects a plurality of bit lines BL from among a plurality of bit lines BL. A voltage Vinh_bl (e.g., 0 V) to be given to a non-selected bit line BL is inputted to the BL driver 113.

On the basis of a control signal Ctrl by the microcontroller 20 and write data WDATA by the R/W latch 115, the R/W voltage switch 114 switches voltages of nodes GWL and GBL to which selected word line WL and bit line BL are coupled. The write data WDATA corresponds to 1-bit data of write data (Dw, D0, D1, and Dinv) described later. The R/W latch 115 outputs the write data WDATA inputted from the microcontroller 20 to the R/W voltage switch 114. The R/W latch 115 further outputs read data RDATA inputted from the sense amplifier 116 to the microcontroller 20. The read data RDATA corresponds to 1-bit data of read data (Dr, Dr1, and Dr2) described later.

On the basis of the control signal Ctrl by the microcontroller 20, the sense amplifier 116 compares a voltage of the node GWL obtained from the WL driver 112 with Vref (e.g., about −1V) to determine whether the resistance change element VR is in a low-resistance state (LRS) or in a high-resistance state (HRS). The sense amplifier 116 generates logic zero in a case where the resistance change element VR is in the low-resistance state (LRS), and logic one is generated in a case where the resistance change element VR is in the high-resistance state (HRS), thereby generating the read data RDATA. The sense amplifier 116 outputs the generated read data RDATA to the R/W latch 115.

Suppose that, when the resistance change element VR is in the low-resistance state (LRS), a voltage across the memory cell MC is swept from 0 V. At this time, in a case where the voltage across the memory cell MC drops at 4 V, for example, to cause a current to abruptly flow into the memory cell MC, this phenomenon is called snap, and a snap voltage Vth_LRS is 4 V. When the resistance change element VR is in the high-resistance state (HRS), the snap voltage Vth_HRS becomes higher than the snap voltage Vth_LRS, and reaches 6 V, for example. When 5 V, for example, is applied to the memory cell MC of which a state is desired to be known, the resistance change element VR is snapped when the resistance change element VR is in the low-resistance state (LRS), whereas the resistance change element VR is not snapped when the resistance change element VR is in the high-resistance state (HRS). Accordingly, discerning whether the snap is present or absent makes it possible to achieve the reading from the memory cell MC. When the resistance change element VR is in the high-resistance state (HRS), by snapping the resistance change element VR to flow a current of about 50 µA, for example, into the memory cell MC in a predetermined direction, the resistance change element VR changes into the low-resistance state (LRS). When the resistance change element VR is in the low-resistance state (LRS), by snapping the resistance change element VR to flow a current of about 30 µA, for example, into the memory cell MC in a predetermined direction, the resistance change element VR changes into the high-resistance state (HRS). Combination of the above-described reading and the change in resistance of the resistance change element VR makes it possible to achieve the writing into the memory cell MC.

In a case of reading the memory cell MC, for example, the tile 10_i charges a lower word line LWL0 to −2.5 V, and then brings it into a floating state. Further, for example, the tile 10_i applies +2.5 V to a bit line BL0. As a result, when the resistance change element VR of the memory cell MC at an intersection of the lower word line LWL0 and the bit line BL0 is in the low-resistance state (LRS), the resistance change element VR is snapped to discharge a parasitic capacitance of the lower word line LWL0, thus causing a potential of the lower word line LWL0 to rise to around 0 V. When the resistance change element VR of the memory cell MC at the intersection of the lower word line LWL0 and the bit line BL0 is in the high-resistance state (HRS), the resistance change element VR is not snapped to cause only a slight leakage current to flow to the lower word line LWL0, and thus the potential of the lower word line LWL0 is kept around −2 V. At this time, for example, the tile 10_i compares the potential of the lower word line LWL0 with the Vref (e.g., about −1 V) by using the sense amplifier 116 to determine whether the resistance change element VR is in the low-resistance state (LRS) or in the high-resistance state (HRS). For example, the tile 10_i generates logic zero in a case where the resistance change element VR is in the low-resistance state (LRS), and generates logic one in a case where the resistance change element VR is in the high-resistance state (HRS), thereby generating the read data RDATA. For example, the tile 10_i outputs the generated read data RDATA to the microcontroller 20.

Incidentally, for each data unit in the memory cell array unit 400 accessed by the host computer 100, a data unit of each of the banks 410-k for writing and reading is very small, and is n bits (e.g., 16 bits). In order to meet a request (in particular, read request) of the host computer 100 with minimal delay, the memory controller 300 distributes access granularity of the host computer 100 to a plurality of banks 410-k for controlling reading and writing. Hereinafter, among write data inputted by the host computer 100 to the memory part 200, n-bit data distributed to each of the banks 410-k is referred to as "input data Din". In addition, among data read by the host computer 100 from the memory part 200, n-bit data read from each of the banks 410-k is referred to as "output data Dout".

In each of the banks 410-k, as illustrated in FIG. 4, the microcontroller 20 includes, for example, a defect detection section 21, a write control section 22, a read control section 23, an LSB deletion section 24, and an LSB addition section 25.

For the purpose of ensuring data reliability, and the like, the defect detection section 21 determines presence or absence of a defect in the n-bit allocation memory cell for each request of writing or reading from the memory controller 300 (host computer 100). Specifically, the defect detection section 21 determines whether or not there is a defect in the memory cell MC (n-bit allocation bit Ba) to be a target (access target) of writing or reading among n-bit tiles 10_i, for each request of writing or reading from the memory controller 300 (host computer 100). Examples of this defect include a hardware defect in which the memory cell MC is disconnected or short-circuited, and a probability error. In the probability error, in a case where writing is repeatedly performed under the same condition, on very rare occasion, it is not possible to correctly perform writing or reading into or from the memory cell MC. In addition, this defect includes not only an initial defect but also a later defect that occurs over time. This method of determining the defect is described in detail later.

When d pieces of (1≤d≤n) defective memory cells MC are found during a writing operation, the LSB deletion section 24 excludes, among n-bit input data Din, data from a least significant bit LSB to d-th bit from a side of the least significant bit LSB, thereby generating n–d-bit write data Dw. The write control section 22 writes the n–d-bit write data Dw into n–d-bit allocation memory cells excluding d pieces of defective allocation memory cells, among the n-bit allocation memory cells.

When one defective memory cell MC is found during a writing operation, the LSB deletion section 24 generates n–1-bit write data Dw excluding data of a least significant bit among the n-bit input data Din. The write control section 22 writes the n–1-bit write data Dw into n–1-bit allocation memory cells excluding one defective allocation memory cell, among the n-bit allocation memory cells.

The read control section 23 reads one bit by one bit from each of the tiles 10_i to thereby acquire n-bit data Dr.

When d pieces of defective memory cells MC are found during a reading operation, the LSB addition section 25 generates n–d-bit data Dr' excluding data of bits corresponding to the d pieces of defective allocation memory cells, among the n-bit data Dr. The LSB addition section 25 adds d-bit data as a bit on the least significant side to the generated n–d-bit data Dr', thereby generating n-bit data (output data Dout). The LSB addition section 25 outputs the generated n-bit output data Dout to the memory controller 300 (host computer 100).

When one defective memory cell MC is found during a reading operation, the LSB addition section 25 generates n–1-bit data Dr' excluding data of a bit corresponding to the one defective allocation memory cell, among the n-bit data Dr. The LSB addition section 25 adds 1-bit data as the least significant bit to the generated n–1-bit data Dr', thereby generating the n-bit data (output data Dout). The LSB addition section 25 outputs the generated n-bit output data Dout to the memory controller 300 (host computer 100).

When no defective memory cell MC is found during a writing operation, the LSB deletion section 24 outputs the n-bit input data Din as n-bit write data Dw into the write control section 22. The write control section 22 writes the inputted n-bit write data Dw into the memory cell array 10. When no defective memory cell MC is found during a reading operation, the LSB addition section 25 outputs, as the output data Dout, the n-bit data Dr acquired from the read control section 23 to the memory controller 300 (host computer 100).

FIG. 8 illustrates an example of a writing operation in each of the banks 410-k. FIG. 8 illustrates an example of the input data Din and the write data Dw at the time of n=16. The defect detection section 21 acquires the input data Din from the host computer 100 (step S101). Further, when acquiring, from the host computer 100, control data Cin including a write command, a die ID, a bank address, a Row address, and a Column address, the defect detection section 21 determines whether or not there is a defect in the memory cell MC to be a write target (access target), among n-bit tiles 10_i to which the n-bit allocation bit Ba is allocated (step S102).

As a result, in a case where one defective memory cell MC is found (step S103; Y), the defect detection section 21 outputs, to the LSB deletion section 24, data on the number and positions of bits (defect position bits Bx) in which the defects are found, and outputs, to the write control section 22, the data on the positions of the bits (defect position bits Bx) in which the defects are found. On the basis of the data on the number and positions of the defect position bits Bx, the LSB deletion section 24 generates n–1-bit write data Dw excluding data of the least significant bit among the n-bit input data in inputted from the host computer 100 (step S104). The LSB deletion section 24 outputs the generated n–1-bit write data Dw to the write control section 22. On the basis of the data on the positions of the defect position bits Bx, the write control section 22 writes the n–1-bit write data Dw into the n–1-bit allocation memory cells excluding a defective allocation memory cell, among the n-bit allocation memory cells. That is, the write control section 22 skips the defective memory cell MC, and executes writing of the n–1-bit write data Dw (step S105).

Meanwhile, in a case where no defective memory cell MC is found (step S103; N), the defect detection section 21 outputs, as the n-bit write data Dw, the n-bit input data Din inputted from the host computer 100 to the write control section 22. The write control section 22 writes the n-bit write data Dw into the n-bit allocation memory cell (step S106).

FIG. 9 illustrates an example of a reading operation in each of the banks 410-k. FIG. 9 illustrates an example of the data Dr and the output data Dout at the time of n=16. When acquiring, from the host computer 100, control data Cin including a read command, a die ID, a bank address, a Row address, and a Column address, the defect detection section 21 reads data from the memory cell MC (n-bit allocation memory cell) to be a read target (access target), among the n-bit tiles 10_i, to thereby acquire the n-bit data Dr (step S201). At this time, the defect detection section 21 determines whether or not there is a defect in the memory cell MC (n-bit allocation memory cell) to be a read target (access target), among the n-bit tiles 10_i (step S202).

As a result, in a case where one defective memory cell MC is found (step S203; Y), the defect detection section 21 outputs, to the LSB addition section 25, data on the number and positions of bits (defect position bits Bx) in which the defects are found, and outputs, to the read control section 23, the data on the positions of the bits (defect position bits Bx) in which the defects are found. On the basis of the data on the number and positions of the defect position bits Bx, the defect detection section 21 generates n–1-bit read data Dr' excluding data of a bit corresponding to the defective allocation memory cell, among the read n-bit data Dr (step S204). The defect detection section 21 outputs the generated n–1-bit read data Dr' to the LSB addition section 25. On the basis of the data on the number of the defect position bits Bx, the LSB addition section 25 adds 1-bit data as the least significant bit to the n–1-bit read data Dr', thereby generating the n-bit data (output data Dout) (step S205). At this time, the 1-bit data to be added as the least significant bit is specific data, and is zero or one, for example.

Meanwhile, in a case where no defective memory cell MC is found (step S203; N), the defect detection section 21 outputs the read n-bit data Dr as n-bit read data (output data Dout) to the LSB addition section 25. The LSB addition section 25 outputs the output data Dout to the memory controller 300 (host computer 100) (step S206).

Next, description is given of defect determination in each of the banks 410-k. FIG. 10 illustrates an example of a procedure to determine presence or absence of a defect in a writing operation or a reading operation. FIG. 10 illustrates an example of data D0, data Dr1, and data Dr2 at the time of n=16.

The defect detection section 21 first generates n-bit data D0 in which all the bits are zero, and outputs the generated n-bit data D0 to the write control section 22. When the data D0 is inputted from the defect detection section 21, the write control section 22 writes the inputted data D0 into n pieces of tiles 10_i included in the memory cell array 10 (step S301). Specifically, the write control section 22 writes the inputted data D0 into the memory cell MC (n-bit allocation memory cell) to be an access target, among the n pieces of tiles 10_i. Next, the defect detection section 21 requests the read control section 23 to read data from the memory cell MC (n-bit allocation memory cell) into which the writing has been performed in step S301. Then, the read control section 23 reads the data from the memory cell MC (n-bit allocation memory cell) into which the writing has been performed in step S301 to thereby acquire the n-bit data Dr1 (step S302). The read control section 23 outputs the acquired Dr1 to the defect detection section 21.

Next, the defect detection section 21 generates n-bit data D1 in which all the bits are one, and outputs the generated n-bit data D1 to the write control section 22. When the data D1 is inputted from the defect detection section 21, the write control section 22 writes the inputted data D1 into the memory cell MC (n-bit allocation memory cell) into which the writing has been performed in step S301 (step S303). Next, the defect detection section 21 requests the read control section 23 to read data from the memory cell MC (n-bit allocation memory cell) into which the writing has been performed in step S303. The read control section 23 reads the data from the memory cell MC (n-bit allocation memory cell) into which the writing has been performed in step S303 to thereby acquire n-bit data Dr2 (step S304). The read control section 23 outputs the acquired Dr2 to the defect detection section 21.

The defect detection section 21 uses the data Dr1 and the data Dr2 inputted from the read control section 23 to perform defect determination of the memory cell MC (n-bit allocation memory cell) into which the writing has been performed in steps S301 and S303 (step S305). Specifically, the defect detection section 21 determines whether or not one is included in the data Dig; in a case where one is included, the defect detection section 21 generates data (defect detection data) including data of a bit (defect position bit Bx) corresponding to one in the data Dr1 and data on the number of one included in the data Dr1.

The defect detection section 21 further determines whether or not zero is included in the data Dr2; in a case where zero is included, the defect detection section 21 generates data (defect detection data) including data of a bit (defect position bit Bx) corresponding to zero in the data Dr2 and data on the number of zero included in the data Dr2. On the basis of the defect detection data generated on the basis of the data Dr1 and the defect detection data generated on the basis of the data Dr2, the defect detection section 21 generates defect detection data Da including data on the positions and number of defective bits included in the n-bit allocation memory cell.

In a case where one is not included in the data Dr1 or in a case where zero is not included in the data Dr2 (i.e., in a case where no defective bit exists in the n-bit allocation memory cell), the defect detection section 21 generates, as the defect detection data Da, data not including the data on the positions and number of defective bits. In this manner, the defect detection section 21 performs defect detection.

The defect detection section 21 determines, on the basis of the defect detection data Da, whether or not there is a defect in the n-bit allocation memory cell.

The defect detection section 21 may perform defect determination, for example, in a procedure as illustrated in FIG. 11 in the reading operation. FIG. 11 illustrates a modification example of a procedure to determine presence or absence of a defect in the reading operation. FIG. 11 illustrates an example of the inverted data Dinv and the data Dr2 at the time of n=16.

The defect detection section 21 first generates data (n-bit inverted data Dinv) in which the read n-bit data Dr is inverted (step S401). The defect detection section 21 outputs the generated inverted data Dinv to the write control section 22. When the inverted data Dinv is inputted from the defect detection section 21, the write control section 22 writes the inputted inverted data Dinv into n pieces of tiles 10_i included in the memory cell array 10 (step S402). Specifically, the write control section 22 writes the inputted inverted data Dinv into the memory cell MC (n-bit allocation memory cell) from which the reading has been performed in step S201, among the n pieces of tiles 10_i. Next, the defect detection section 21 requests the read control section 23 to read data from the memory cell MC (n-bit allocation memory cell) into which the writing has been performed in step S402. Then, the read control section 23 reads the data from the memory cell MC (n-bit allocation memory cell) into which the writing has been performed in step S402 to thereby acquire the n-bit data Dr2 (step S403). The read control section 23 outputs the acquired Dr2 to the defect detection section 21.

The defect detection section 21 compares the inverted data Dinv and the data Dr2, which are acquired from the read control section 23, with each other to perform defect determination of the memory cell MC (n-bit allocation memory cell) from which the reading has been performed in steps S201 and S403 (step S404). For example, the defect detection section 21 compares, in order, the inverted data Dinv and the data Dr2 with each other one bit by one bit from an MSB side to determine whether or not they are consistent with each other. In a case where an inconsistent bit is found, the defect detection section 21 generates data (defect detection data) on the positions and number of bits (defect position bits Bx) inconsistent with the inverted data Dinv, among the data Dr2. In a case where no inconsistent bit is found (i.e., in a case where no defective bit exists in the n-bit allocation memory cell), the defect detection section 21 generates, as the defect detection data Da, data not including the data on the positions and number of defective bits. Finally, the defect detection section 21 writes (writes back) the data Dr into the memory cell MC (n-bit allocation memory cell) from which the reading has been performed in steps S201 and S403. In this manner, the defect detection section 21 performs defect detection. The defect detection section 21 determines, on the basis of the defect detection data Da, whether or not there is a defect in the n-bit allocation memory cell.

[Effects]

Next, description is given of effects of the memory cell array unit 400 according to an embodiment.

A memory module including a rewritable non-volatile memory element has heretofore been known. In recent years, focus has been placed on a resistive RAM (ReRAM (Resistive RAM) as a rewritable memory module provided with a storage capacity exceeding that of a DRAM while having non-volatility. In a case where a defect occurs in a certain non-volatile memory element in such a memory module, it is conceivable to store address information on the defective non-volatile memory element, for example, in a defect position table, in order to avoid the defective non-volatile memory element. In a case where there are a large number of defective non-volatile memory elements, however, a defect position table having a large capacity is necessary to store address information thereon. In addition, the above-described memory cell array unit may employ an error correction code in some cases as a countermeasure for errors after writing. However, in a case where a defective non-volatile memory element is allocated to an LSB in order to be less influenced by the defective non-volatile memory element, any bits are influenced in the same manner for the error correction code. Therefore, the use of the defective non-volatile memory element increases probability of a failure in decoding, thus degrading error resilience to a later defect.

Meanwhile, in the present embodiment, when a defect is found in one of the n-bit allocation memory cells in the memory cell array 10, the n−1-bit write data Dw excluding data of the least significant bit, among the n-bit write data (input data Din), is written into the n−1-bit allocation memory cells excluding the defective allocation memory cell, among the n-bit allocation memory cells. In a case where encoding is performed using the above-described n−1-bit write data Dw, there is no influence of the defective allocation memory cell upon decoding, which may therefore suppress probability of a failure in decoding to a low level. As a result, it is possible to deal with a later defect of a memory as well without using a defect position table. In addition, unlike bit or word line substitution, defect positions that differ for respective words (e.g., for every 16 bits) are avoided, thus making it possible to improve the yield as well. In addition, the present technology is suitably applicable to data (e.g., grayscale data on an image, data on a filter coefficient, etc.) which is relatively less influential even when an error occurs in a low-order bit.

In addition, in the present embodiment, when a defect is found in a portion (d pieces) of the n-bit allocation memory cells in the memory cell array 10, the n−d-bit write data Dw excluding data of the least significant bit to d-th bit, among the n-bit write data (input data Din), is written into the n−d-bit allocation memory cells excluding the d pieces of defective allocation memory cells, among the n-bit allocation memory cells. Accordingly, for example, in a case where encoding is performed using the above-described n−d-bit write data Dw, there is no influence of the defective allocation memory cell upon decoding, which may therefore suppress probability of a failure in decoding to a low level. As a result, it is possible to deal with a later defect of a memory as well without using a defect position table. In addition, unlike bit or word line substitution, defect positions that differ for respective words (e.g., for every 16 bits) are avoided, thus making it possible to improve the yield as well. In addition, the present technology is suitably applicable to data (e.g., grayscale data on an image, data on a filter coefficient, etc.) which is relatively less influential even when an error occurs in a low-order bit.

In addition, in the present embodiment, a determination is made as to the presence or absence of a defect in the n-bit allocation memory cell every time reading or writing is performed on the memory cell array 10. This makes it possible to deal with a defect in the memory without using a fuse or a defect position table.

In addition, in the present embodiment, when a defect is found in one of the n-bit allocation memory cells, n-bit data generated by adding, as the least significant bit, the n−1-bit read data (data Dr') excluding data of a bit corresponding to the defective allocation memory cell, among n-bit read data (data Dr) read from the n-bit allocation memory cell, is outputted as the n-bit output data Dout to the memory controller 300. This makes it possible to deal with a defect in the memory by using the 1-bit redundant memory cell without using a fuse or a defect position table.

In addition, in the present embodiment, when no defect is found in the n-bit allocation memory cell, the n-bit write data Dw is written into the n-bit allocation memory cell. In this manner, in a case where there is no defect in the memory, writing the n-bit data Dw into the n-bit allocation memory cell makes it possible to perform correct data writing.

In addition, in the present embodiment, when no defect is found in the n-bit allocation memory cell, the n-bit read data (data Dr) is outputted as the output data Dout to the memory controller. In this manner, in a case where there is no defect in the memory, reading the n-bit data from the n-bit allocation memory cell makes it possible to perform correct data reading.

2. MODIFICATION EXAMPLES

Next, description is given of modification examples of the information processing system according to the foregoing embodiment.

Modification Example A

FIG. 12 illustrates a modification example of the bank 410-k according to the foregoing embodiment.

In each of the banks 410-k according to the present modification example, the memory cell array 10 may include, for example, n+a pieces of (21 at the time of n=16 and a=5) tiles 10_i, as illustrated in FIG. 12. At this time, the microcontroller 20 controls access to each of the tiles 10_i and communicates with the memory controller 300. In each of the banks 410-k, the microcontroller 20 operates the plurality of tiles 10_i in a coordinated manner to achieve access to a data block of a predetermined bit size as a whole.

In each of the banks 410-k, on the basis of the read/write control from the memory controller 300, for example, the microcontroller 20 reads and writes n+a-bit data from and into the memory cell array 10 using an n-bit allocation bit Ba, which is allocated for data writing or data reading to each of the banks 410-k from the memory controller 300 and an a-bit ECC (Error Correction Code) parity bit Becc. That is, for example, the microcontroller 20 reads and writes n-bit data from and into the memory cell array 10 using the n-bit allocation bit Ba, which is allocated for data writing or data reading to each of the banks 410-k from the memory controller 300, and reads and writes a-bit data from and into the memory cell array 10 using the a-bit ECC parity bit Becc.

There are two objectives of the ECC parity. The first is to correct a bit error that occurs randomly in a transmission path during writing into the memory cell array 10. The second is to allow occurrence of a bit defect up to a predetermined number of bits when the bit defect occurs accidentally or due to wear during writing into the memory cell array 10, and to ensure data reliability by decoding (error correction) during reading.

It is to be noted that the memory cell array 10 includes n-bit (n pieces of) allocation memory cells and a-bit (a pieces of) ECC parity memory cells. It is to be noted that the memory cell array 10 is not provided with a switching mechanism (e.g., fuse circuit) to switch to a 1-bit redundant memory cell as a substitution for a portion of the a-bit ECC parity memory cell and the n-bit allocation memory cell.

In each of the banks 410-k, on the basis of the read/write control from the memory controller 300, for example, the microcontroller 20 accesses an n+a-bit data block in which the a-bit ECC parity bit Becc is added to the n-bit allocation bit Ba. At this time, the microcontroller 20 accesses an n-bit memory cell and the a-bit ECC parity memory cell in the memory cell array 10. In each of the banks 410-k, for example, when performing "defect determination", which is preprocessing upon data writing or data reading, the microcontroller 20 accesses the n-bit allocation memory cell and the a-bit ECC parity memory cell.

In the bank 410-k according to the present modification example, for example, as illustrated in FIG. 12, the microcontroller 20 may further include an ECC encoding section 26 and an ECC decoding section 27, in addition to the defect detection section 21, the write control section 22, the read control section 23, the LSB deletion section 24, and the LSB addition section 25.

For the purpose of ensuring data reliability, and the like, the defect detection section 21 determines presence or absence of a defect in the n-bit allocation memory cell and the a-bit ECC parity memory cell for each request of writing or reading from the memory controller 300 (host computer 100). Specifically, the defect detection section 21 determines whether or not there is a defect in the memory cell MC (n-bit allocation bit Ba, a-bit ECC parity bit Becc) to be a target (access target) of writing or reading among n+a-bit tiles 10_i, for each request of writing or reading from the memory controller 300 (host computer 100).

When d pieces of (1≤d≤n+a) defective memory cells MC are found during a writing operation, the LSB deletion section 24 generates n−d-bit input data excluding data of the least significant bit LSB to d-th bit from the side of the least significant bit LSB, among the n-bit input data Din. The LSB deletion section 24 further adds d pieces of dummy bits DB to a side of a most significant bit MSB in the generated n−d-bit input data, thereby generating n-bit input data Din'. The LSB deletion section 24 outputs the generated n-bit input data Din' to the ECC encoding section 26.

When one defective memory cell MC is found during a writing operation, the LSB deletion section 24 generates n−1-bit input data excluding data of the least significant bit LSB among the n-bit input data Din. The LSB deletion section 24 further adds one dummy bit DB to the side of the most significant bit MSB in the generated n−1-bit input data, thereby generating the n-bit input data Din'. The LSB deletion section 24 outputs the generated n-bit input data Din' to the ECC encoding section 26. When no defective memory cell MC is found during a writing operation, the LSB deletion section 24 outputs the n-bit input data Din to the ECC encoding section 26.

The ECC encoding section 26 encodes n-bit input data din' or the n-bit input data Din inputted from the LSB deletion section 24. The ECC encoding section 26 generates a-bit (e.g., 5-bit) ECC parity data, for example, on the basis of the n-bit input data Din' or the n-bit input data Din. The ECC encoding section 26 further adds the generated a-bit ECC parity data to the side of the least significant bit LSB of the n-bit input data Din or the n-bit input data Din', and excludes data from the most significant bit MSB to d-th bit from the most significant bit MSB, thereby generating n+a−d-bit write data Dw. The ECC encoding section 26 outputs the generated n+a−d-bit write data Dw to the write control section 22.

When d pieces of defective memory cells MC are found, the write control section 22 writes the n+a−d-bit write data Dw to n+a−d-bit memory cells MC excluding the d pieces of defective memory cells among the n-bit allocation memory cells (memory cells MC) and the a-bit ECC parity memory cells (memory cells MC). When one defective memory cell MC is found, the write control section 22 writes n+a−1-bit write data Dw into the n+a−1-bit memory cells MC excluding the one defective memory cell among the n-bit allocation memory cells (memory cells MC) and the a-bit ECC parity memory cells (memory cells MC). When no defective memory cell MC is found, the write control section 22 writes n+a-bit write data Dw into the n-bit allocation memory cell (memory cell MC) and the a-bit ECC parity memory cell (memory cell MC).

The read control section 23 reads one bit by one bit from each of the tiles 10_i to thereby acquire n+a-bit data Dr. When d pieces of defective memory cells MC are found, the read control section 23 generates n+a−d-bit data excluding data of bits corresponding to the d pieces of defective allocation memory cells, among the acquired n+a-bit data Dr. The read control section 23 adds d pieces of dummy bits DB to the side of the most significant bit MSB in the generated n+a−d-bit data, thereby generating n+a-bit data Dr'. The read control section 23 outputs the generated n+a-bit data Dr' to the ECC decoding section 27.

When one defective memory cell MC is found, the read control section 23 generates n+a−1-bit data excluding data of a bit corresponding to the one defective allocation memory cell, among the acquired n+a-bit data Dr. The read control section 23 adds one dummy bit DB to the side of the most significant bit MSB in the generated n+a−1-bit data, thereby generating the n+a-bit data Dr'. The read control section 23 outputs the generated n+a-bit data Dr' to the ECC decoding section 27. When no defective memory cell MC is found, the read control section 23 outputs the acquired n+a-bit data Dr to the ECC decoding section 27.

The ECC decoding section 27 decodes the n+a-bit data Dr' or the n+a-bit data Dr' inputted from the read control section 23. For example, the ECC decoding section 27 decodes n-bit data of a portion, excluding the a-bit ECC parity data, in the n+a-bit data Dr' or the n+a-bit data Dr inputted from the read control section 23, by using the a-bit ECC parity data.

When d pieces of defective memory cells MC are found in a reading operation, the ECC decoding section 27 excludes d pieces of dummy bits DB on the side of the most significant bit MSB in the n-bit data obtained by the decoding, thereby generating n−d-bit output data Dout'. The ECC decoding section 27 outputs the generated n−d-bit output data Dout' to the LSB addition section 25. When one defective memory cell MC is found in a reading operation, the ECC decoding section 27 excludes the dummy bit DB of the most significant bit MSB in the n-bit data obtained by the decoding, thereby generating n−1-bit output data Dout'. The ECC decoding section 27 outputs the generated n−1-bit output data Dout' to the LSB addition section 25. When no defective memory cell MC is found in a reading operation, the ECC decoding section 27 outputs the n-bit data obtained by the decoding as the output data Dout to the LSB addition section 25.

When d pieces of defective memory cells are found in a reading operation, the LSB addition section 25 adds d-bit data as the data on the side of the least significant bit LSB to the n−d-bit output data Dout', thereby generating the n-bit data (output data Dout). The d-bit data to be added is specific data, e.g., one or zero. The LSB addition section 25 outputs the generated n-bit output data Dout to the memory controller 300 (host computer 100).

When one defective memory cell MC is found during a reading operation, the LSB addition section 25 adds 1-bit data as the data on the side of the least significant bit LSB to the n−d-bit output data Dout', thereby generating the n-bit data (output data Dout). The 1-bit data to be added is specific data, e.g., one or zero. The LSB addition section 25 outputs the generated n-bit output data Dout to the memory controller 300 (host computer 100). When no defective memory cell MC is found during a reading operation, the LSB addition section 25 outputs the n-bit output data Dout inputted from the ECC decoding section 27 to the memory controller 300 (host computer 100).

FIG. 13 illustrates an example of a writing operation in each of the banks 410-k. FIG. 13 illustrates an example of the input data Din and the write data Dw at the time of n=16 and a=5. The defect detection section 21 acquires the input data Din from the host computer 100 (step S501). Further, when the control data Cin including a write command, a die ID, a bank address, a Row address, and a Column address is inputted from the host computer 100, the defect detection section 21 determines whether or not there is a defect in the memory cell MC to be a write target (access target), among the n-bit tiles 10_i to which the n-bit allocation bit Ba and the a-bit ECC parity bit Becc are allocated (step S502).

As a result, in a case where one defective memory cell MC is found (step S503; Y), the defect detection section 21 outputs, to the LSB deletion section 24, data on the number and positions of bits (defect position bits Bx) in which the defects are found, and outputs, to the write control section 22, the data on the positions of the bits (defect position bits Bx) in which the defects are found.

On the basis of the data on the number and positions of the defect position bits Bx, the LSB deletion section 24 generates n−1-bit data excluding data of the least significant bit among the n-bit input data Din inputted from the host computer 100 (step S504). The LSB deletion section 24 further adds one dummy bit DB to the side of the most significant bit MSB in the generated n−1-bit input data, thereby generating the n-bit input data Din' (step S504). The LSB deletion section 24 outputs the generated n-bit input data Din' to the ECC encoding section 26.

The ECC encoding section 26 encodes the n-bit input data din' inputted from the LSB deletion section 24 (step S505). The ECC encoding section 26 generates the a-bit (e.g., 5-bit) ECC parity data, for example, on the basis of the n-bit input data Din'. The ECC encoding section 26 further adds the generated a-bit ECC parity data to the side of the least significant bit LSB of the n-bit input data Din', and excludes data of the most significant bit MSB (dummy bit DB), thereby generating the n+a−1-bit write data Dw. The ECC encoding section 26 outputs the generated n+a−1-bit write data Dw to the write control section 22. The write control section 22 writes the n+a−1-bit write data Dw into the n+a−1-bit memory cells MC excluding one defective memory cell among the n-bit allocation memory cells (memory cells MC) and the a-bit ECC parity memory cells (memory cells MC) (step S506).

Meanwhile, in a case where no defective memory cell MC is found (step S503; N), the defect detection section 21 outputs the n-bit input data Din to the ECC encoding section 26. The ECC encoding section 26 encodes the n-bit input data Din (step S507). The ECC encoding section 26 generates the a-bit (e.g., 5-bit) ECC parity data, for example, on the basis of the n-bit input data Din. The ECC encoding section 26 further adds the generated a-bit ECC parity data to the side of the least significant bit LSB of the n-bit input data Din', thereby generating the n+a-bit write data Dw. The ECC encoding section 26 outputs the generated n+a-bit write data Dw to the write control section 22. The write control section 22 writes the n+a-bit write data Dw into the n-bit allocation memory cell (memory cell MC) and the a-bit ECC parity memory cell (memory cell MC) (step S508).

FIG. 14 illustrates an example of a reading operation in each of the banks 410-k. FIG. 14 illustrates an example of the data Dr and the output data Dout at the time of n=16 and a=5. When acquiring, from the host computer 100, the control data Cin including a read command, a die ID, a bank address, a Row address, and a Column address, the defect detection section 21 reads data from the memory cell MC (n-bit allocation memory cell, a-bit ECC parity memory cell) to be a read target (access target), among the n+a-bit tiles 10_i, to thereby acquire the n+a-bit data Dr (step S601). At this time, the defect detection section 21 determines whether or not there is a defect in the memory cell MC (n-bit allocation memory cell) to be a read target (access target), among the n+a-bit tiles 10_i (step S602).

As a result, in a case where one defective memory cell MC is found (step S603; Y), the defect detection section 21 outputs, to the LSB addition section 25, data on the number and positions of bits (defect position bits Bx) in which the defects are found, and outputs, to the read control section 23, the data on the positions of the bits (defect position bits Bx) in which the defects are found. On the basis of the data on the number and positions of the defect position bits Bx, the read control section 23 generates n+a−1-bit read data excluding data of a bit corresponding to the defective allocation memory cell, among the read n+a-bit data Dr (step S604). The read control section 23 adds 1-bit dummy bit DB to the generated n+a−1-bit read data on the side of the most significant bit MSB, thereby generating the n+a-bit data Dr'. The defect detection section 21 outputs the generated n+a-bit data Dr' to the ECC decoding section 27.

The ECC decoding section 27 decodes the n+a-bit data Dr' inputted from the read control section 23 (step S605). For example, the ECC decoding section 27 decodes n-bit data of a portion, excluding the a-bit ECC parity data, in the n+a-bit data Dr' inputted from the read control section 23, using the a-bit ECC parity data. The ECC decoding section 27 excludes the dummy bit DB of the most significant bit MSB in the n-bit data obtained by the decoding, thereby generating the n−1-bit output data Dout'. The ECC decoding section 27 outputs the generated n−1-bit output data Dout' to the LSB addition section 25. The LSB addition section 25 adds 1-bit data as the data on the side of the least significant bit LSB to the n−1-bit output data Dout', thereby generating the n-bit data (output data Dout) (step S606). The ECC decoding section 27 outputs the generated n-bit output data Dout to the memory controller 300 (host computer 100) (step S608).

Meanwhile, in a case where no defective memory cell MC is found (step S603; N), the defect detection section 21 outputs the n+a-bit data Dr to the ECC decoding section 27. The ECC decoding section 27 decodes the n+a-bit data Dr' inputted from the read control section 23 (step S607). For example, the ECC decoding section 27 decodes n-bit data of a portion, excluding the a-bit ECC parity data, in the n+a-bit data Dr inputted from the read control section 23, using the a-bit ECC parity data. The ECC decoding section 27 outputs the n-bit data obtained by the decoding as the output data Dout to the LSB addition section 25. The ECC decoding section 27 outputs the n-bit output data Dout as it is to the memory controller 300 (host computer 100) (step S608).

In the present modification example, the memory cell array 10 includes the n-bit allocation memory cell and the a-bit ECC parity memory cell. Further, the a-bit ECC parity data generated on the basis of data written into the n-bit allocation memory cell is written into the a-bit ECC parity memory cell. Accordingly, even in a case where two or more defects exist in the n-bit allocation memory cell, the use of the ECC parity data makes it possible to deal with a defect in the memory without using a fuse or a defect position table.

Modification Example B

FIG. 15 illustrates a modification example of a writing operation in each of the banks 410-$k$ according to Modification Example B described above.

First, the ECC encoding section 26 acquires the input data Din from the host computer 100 (step S701). Further, when the control data Cin including a write command, a die ID, a bank address, a Row address, and a Column address is inputted from the host computer 100, the ECC encoding section 26 encodes the acquired n-bit input data Din (step S702). For example, the ECC encoding section 26 generates the a-bit (e.g., 5-bit) ECC parity data on the basis of the n-bit input data Din. The ECC encoding section 26 further adds the generated a-bit ECC parity data to the side of the least significant bit LSB of the n-bit input data Din', thereby generating n+a-bit write data Dw1. The ECC encoding section 26 outputs the generated n+a-bit write data Dw1 to the write control section 22. The write control section 22 writes the n+a-bit write data Dw1 inputted from the ECC encoding section 26 into the n-bit allocation memory cell (memory cell MC) and the a-bit ECC parity memory cell (memory cell MC) (step S703). The write control section 22 outputs the n+a-bit write data Dw1 to the defect detection section 21.

Next, the read control section 23 reads data from the memory cell MC (n-bit allocation memory cell, a-bit ECC parity memory cell) to be a read target (access target), among the n+a-bit tiles 10_$i$, to thereby acquire n+a-bit data Dr1 (step S704). That is, the read control section 23 reads data from the n-bit allocation memory cell (memory cell MC) and the a-bit ECC parity memory cell (memory cell MC) to which writing has been performed previously, to thereby acquire the n+a-bit data Dr1. The read control section 23 outputs the n+a-bit data Dr1 to the defect detection section 21.

Next, the defect detection section 21 determines whether or not there is a defect in the memory cell MC (n-bit allocation memory cell) to be a read target (access target), among the n+a-bit tiles 10_$i$ (step S705). Specifically, the defect detection section 21 compares the n+a-bit write data Dw1 inputted from the write control section 22 and the n+a-bit data Dr1 inputted from the read control section 23 with each other to determine whether or not they are consistent with each other. In a case where an inconsistent bit is found, the defect detection section 21 generates data (defect detection data) on the positions and number of bits (defect position bits Bx), in the data Dr1, inconsistent with the write data Dw1. In a case where no inconsistent bit is found (i.e., in a case where no defective bit exists in the n-bit allocation memory cell and the a-bit ECC parity memory cell), the defect detection section 21 generates, as the defect detection data Da, data not including the data on the positions and number of defective bits.

As a result, in a case where one defective memory cell MC is found (step S706; Y), the defect detection section 21 outputs, to the LSB deletion section 24, data on the number and positions of bits (defect position bits Bx) in which the defects are found, and outputs, to the write control section 22, the data on the positions of bits (defect position bits Bx) in which the defects are found.

On the basis of the data on the number and positions of the defect position bits Bx, the LSB deletion section 24 generates n−1-bit data excluding data of the least significant bit among the n-bit input data Din inputted from the host computer 100 (step S707). The LSB deletion section 24 further adds one dummy bit DB to the side of the most significant bit MSB in the generated n−1-bit input data, thereby generating the n-bit input data Din' (step S707). The LSB deletion section 24 outputs the generated n-bit input data Din' to the ECC encoding section 26.

The ECC encoding section 26 encodes the n-bit input data din' inputted from the LSB deletion section 24 (step S708). The ECC encoding section 26 generates the a-bit (e.g., 5-bit) ECC parity data, for example, on the basis of the n-bit input data Din'. The ECC encoding section 26 further adds the generated a-bit ECC parity data to the side of the least significant bit LSB of the n-bit input data Din', and excludes data of the most significant bit MSB (dummy bit DB), thereby generating the n+a−1-bit write data Dw. The ECC encoding section 26 outputs the generated n+a−1-bit write data Dw to the write control section 22. The write control section 22 writes the n+a−1-bit write data Dw into the n+a−1-bit memory cells MC excluding one defective memory cell among the n-bit allocation memory cells (memory cells MC) and the a-bit ECC parity memory cells (memory cells MC) (step S709).

Meanwhile, in a case where no defective memory cell MC is found (step S706; N), the defect detection section 21 is assumed to end the writing in step S703.

FIG. 16 illustrates a modification example of a reading operation in each of the banks 410-$k$ according to Modification Example B described above. FIG. 16 illustrates an example of the data Dr and the output data Dout at the time of n=16 and a=5. When acquiring, from the host computer 100, the control data Cin including a read command, a die ID, a bank address, a Row address, and a Column address, the read control section 23 reads data from the memory cell MC (n-bit allocation memory cell, a-bit ECC parity memory cell) to be a read target (access target), among the n+a-bit tiles 10_$i$, to thereby acquire the n+a-bit data Dr (step S801). The read control section 23 outputs the acquired n+a-bit data Dr to the ECC decoding section 27.

Next, the ECC decoding section 27 decodes the n+a-bit data Dr inputted from the read control section 23 (step S802). For example, the ECC decoding section 27 decodes n-bit data of a portion, excluding the a-bit ECC parity data, in the n+a-bit data Dr inputted from the read control section 23, using the a-bit ECC parity data. Subsequently, the ECC decoding section 27 determines whether or not the decoding is failed. Specifically, the ECC decoding section 27 compares, in n+a bits inputted from the read control section 23, the n-bit data of the portion excluding the a-bit ECC parity data and the n-bit data obtained by the decoding with each other to determine whether or not they are consistent with each other. In a case where they are inconsistent with each other (i.e., in a case where the decoding is failed), the defect detection section 21 determines presence or absence of a defective bit (step S804). For example, the defect detection section 21 performs determination using the methods described in step S401 to step S406 described above.

As a result, in a case where one defective memory cell MC is found, the defect detection section 21 outputs, to the LSB addition section 25, data on the number and positions of bits (defect position bits Bx) in which the defects are found, and outputs, to the read control section 23, the data on the positions of bits (defect position bits Bx) in which the defects are found. On the basis of the data on the number and positions of the defect position bits Bx, the read control section 23 generates n+a–1-bit read data excluding data of a bit corresponding to the defective allocation memory cell, among the read n+a-bit data Dr (step S805). The read control section 23 adds the 1-bit dummy bit DB to the generated n+a–1-bit read data on the side of the most significant bit MSB, thereby generating the n+a-bit data Dr'. The defect detection section 21 outputs the generated n+a-bit data Dr' to the ECC decoding section 27.

The ECC decoding section 27 decodes the n+a-bit data Dr' inputted from the read control section 23 (step S806). For example, the ECC decoding section 27 decodes n-bit data of a portion, excluding the a-bit ECC parity data, in the n+a-bit data Dr' inputted from the read control section 23, using the a-bit ECC parity data. The ECC decoding section 27 excludes the dummy bit DB of the most significant bit MSB in the n-bit data obtained by the decoding, thereby generating the n–1-bit output data Dout'. The ECC decoding section 27 outputs the generated n–1-bit output data Dout' to the LSB addition section 25. The LSB addition section 25 adds 1-bit data as the data on the side of the least significant bit LSB to the n–1-bit output data Dout', thereby generating the n-bit data (output data Dout) (step S807). The ECC decoding section 27 outputs the generated n-bit output data Dout to the memory controller 300 (host computer 100) (step S808).

Meanwhile, in a case where the decoding is successful (step S803; N), the ECC decoding section 27 outputs the read data Dr as the output data Dout to the memory controller 300 (host computer 100), assuming that the reading is ended in step S801 (step S808).

Also in the present modification example, the memory cell array 10 includes the n-bit allocation memory cell and the a-bit ECC parity memory cell. Further, the a-bit ECC parity data generated on the basis of data written into the n-bit allocation memory cell is written into the a-bit ECC parity memory cell. Accordingly, even in a case where two or more defects exist in the n-bit allocation memory cell, the use of the ECC parity data makes it possible to deal with a defect in the memory without using a fuse or a defect position table. [Modification Example C]

In the foregoing embodiment and modification examples thereof, a resistive RAM (ReRAM (Resistive RAM) is adopted as the memory cell MC; however, a resistive memory cell in a different form than the resistive RAM may be included. In addition, in the foregoing embodiment and modification examples thereof, the memory cell array 10 is provided inside the die 400-*j* or the bank 410-*k*; however, the memory cell array 10 may be provided inside a memory structure in a form different therefrom.

Although the description has been given of the present technology with reference to the embodiment and modification examples thereof, the present disclosure is not limited to the foregoing embodiment and the like, and may be modified in a wide variety of ways. It is to be noted that the effects described herein are merely exemplary. The effects of the present disclosure are not limited to those described herein. The present disclosure may also have effects other than those described herein.

In addition, for example, the present disclosure may have the following configurations.

(1)

A memory cell array unit subjected to read/write control of n-bit data by a memory controller, the memory cell array unit including:
  a memory cell array including n-bit allocation memory cells allocated from the memory controller in a manner corresponding to the n-bit data in the read/write control; and
  a microcontroller that performs reading and writing from and into the memory cell array using the n-bit allocation memory cells on a basis of the read/write control from the memory controller, in which
  when a defect is found in one of the n-bit allocation memory cells, the microcontroller writes n–1-bit write data excluding data of a least significant bit among n-bit write data into n–1-bit allocation memory cells excluding the defective allocation memory cell among the n-bit allocation memory cells.

(2)

The memory cell array unit according to (1), in which the microcontroller determines presence or absence of a defect in the n-bit allocation memory cells every time the microcontroller performs the reading and the writing from and into the memory cell array.

(3)

The memory cell unit according to (2), in which, when a defect is found in one of the n-bit allocation memory cells, the microcontroller outputs n-bit data as n-bit output data to the memory controller, the n-bit data being generated by adding 1-bit data as a least significant bit to n–1-bit read data excluding data of a bit corresponding to the defective allocation memory cell, among n-bit read data read from the n-bit allocation memory cells.

(4)

The memory cell array unit according to (2) or (3), in which, when no defect is found in the n-bit allocation memory cells, the microcontroller writes the n-bit write data into the n-bit allocation memory cells.

(5)

The memory cell array unit according to (3) or (4), in which, when no defect is found in the n-bit allocation memory cells, the microcontroller outputs the n-bit read data as the output data to the memory controller.

(6)

The memory cell array unit according to any one of (1) to (5), in which the memory cell array includes the n-bit allocation memory cells and a-bit ECC parity memory cells to which an a-bit ECC parity bit is allocated, and the microcontroller writes, into the n–1-bit allocation memory cells and the a-bit ECC parity memory cells, n–1+a-bit first data generated by performing encoding using the n–1-bit write data.

(7)

The memory cell array unit according to (6), in which, when a defect is found in one of the n-bit allocation memory cells, the microcontroller outputs n-bit data as output data to the memory controller, the n-bit data being generated by performing decoding using n+a–1-bit read data excluding data of a bit corresponding to the defective allocation memory cell, among n+a-bit read data read from the n-bit allocation memory cells and the a-bit ECC parity memory cells.

According to the memory cell array unit of an embodiment of the present disclosure, when a defect is found in one of n-bit allocation memory cells in a memory cell array, n−1-bit write data excluding data of a least significant bit among n-bit write data is written into the n−1-bit allocation memory cells excluding the defective allocation memory cell among the n-bit allocation memory cells. This makes it possible to deal with a later defect of the memory as well without using a defect position table. It is to be noted that the effects of the present disclosure are not necessarily limited to the effects described herein, and may be any of the effects described herein.

This application claims the benefit of Japanese Priority Patent Application JP2020-175666 filed with the Japan Patent Office on Oct. 19, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A memory cell array unit comprising:
a memory cell array that includes a plurality of n-bit allocation memory cells, wherein
the memory cell array is configured to receive a control signal from a memory controller,
the control signal comprises n-bit data, and
the memory controller allocates the plurality of n-bit allocation memory cells to the n-bit data; and
a microcontroller configured to:
read and write the n-bit data from and into the memory cell array based on the control signal;
receive n-bit write data and control data from a host computer;
write n−1-bit write data into a plurality of n−1-bit allocation memory cells, wherein the n-bit write data includes n−1-bit write data;
determine a defect in the plurality of n-bit allocation memory cells based on the n-bit write data and the control data;
determine a defective allocation memory cell of the plurality of n-bit allocation memory cells based on the determined defect; and
exclude the defective allocation memory cell and first data, wherein
the n−1-bit write data includes the first data, and
the first data corresponds to a least significant bit of the n−1-bit write data.

2. The memory cell array unit according to claim 1, wherein the microcontroller is further configured to determine the defect each time the microcontroller reads and writes the n-bit data from and into the memory cell array.

3. The memory cell array unit according to claim 2, wherein the microcontroller is further configured to:
read n-bit read data from the plurality of n-bit allocation memory cells, wherein the n-bit read data comprises second data;
generate the n-bit data based on addition of 1-bit data to n−1-bit read data, wherein the 1-bit data corresponds to the least significant bit;
output the generated n-bit data to the memory controller based on the determined defect in the plurality of n-bit allocation memory cells; and
exclude the second data associated with a specific bit, wherein the specific bit corresponds to the defective allocation memory cell.

4. The memory cell array unit according to claim 3, wherein the microcontroller is further configured to output the n-bit read data to the memory controller based on an absence of the defect.

5. The memory cell array unit according to claim 2, wherein the microcontroller is further configured to write the n-bit write data into the plurality of n-bit allocation memory cells based on an absence of the defect.

6. The memory cell array unit according to claim 1, wherein
the memory cell array further includes a plurality of a-bit error correction code (ECC) parity memory cells,
the memory controller allocates an a-bit ECC parity bit to the plurality of a-bit ECC parity memory cells, and
the microcontroller is further configured to:
generate n−1+a-bit first data based on the n−1-bit write data; and
write, into the plurality of n−1-bit allocation memory cells and the plurality of a-bit ECC parity memory cells, the n−1+a-bit first data.

7. The memory cell array unit according to claim 6, wherein the microcontroller is further configured to:
generate n+a−1-bit read data based on the determined defect in the plurality of n-bit allocation memory cells;
generate the n-bit data based on the generated n+a−1-bit read data; and
output the generated n-bit data to the memory controller.

* * * * *